(12) United States Patent
Choi et al.

(10) Patent No.: US 10,700,115 B2
(45) Date of Patent: Jun. 30, 2020

(54) IMAGE SENSORS

(71) Applicant: SAMSUNG ELECTRONICS CO., LTD., Suwon-si (KR)

(72) Inventors: Hyuk Soon Choi, Hwaseong-si (KR); Jung Bin Yun, Hwaseong-si (KR); Jungchak Ahn, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/248,202

(22) Filed: Jan. 15, 2019

(65) Prior Publication Data

US 2019/0148447 A1    May 16, 2019

Related U.S. Application Data

(63) Continuation of application No. 14/959,642, filed on Dec. 4, 2015, now Pat. No. 10,199,421.

(30) Foreign Application Priority Data

Jan. 15, 2015  (KR) .................. 10-2015-0007292

(51) Int. Cl.
    *H01L 27/146*    (2006.01)

(52) U.S. Cl.
    CPC .... *H01L 27/14638* (2013.01); *H01L 27/1463* (2013.01); *H01L 27/1464* (2013.01); *H01L 27/14607* (2013.01); *H01L 27/14609* (2013.01); *H01L 27/14629* (2013.01); *H01L 27/14634* (2013.01); *H01L 27/14643* (2013.01); *H01L 27/14621* (2013.01); *H01L 27/14627* (2013.01)

(58) Field of Classification Search
    CPC ... H01L 27/146–14893; H01L 31/1013; H01L 31/02327; H01L 31/02325
    See application file for complete search history.

(56) References Cited

U.S. PATENT DOCUMENTS

| | | | |
|---|---|---|---|
| 6,448,596 B1 | 9/2002 | Kawajiri et al. |
| 7,423,302 B2 | 9/2008 | Dosluoglu et al. |
| 7,446,357 B2 | 11/2008 | McKee |
| 7,638,825 B2 | 12/2009 | Hong |
| 7,830,437 B2 | 11/2010 | McKee et al. |
| 7,888,716 B2 | 2/2011 | Ichikawa et al. |
| 7,994,464 B2 | 8/2011 | McKee |
| 8,233,071 B2 | 7/2012 | Takeda |
| 8,686,483 B2 | 4/2014 | Michelot et al. |
| 8,749,695 B2 | 6/2014 | Kita |
| 8,759,886 B2 | 6/2014 | Kanbe |

(Continued)

FOREIGN PATENT DOCUMENTS

| JP | 2012-151215 A | 8/2012 |
|---|---|---|
| JP | 2012-160906 A | 8/2012 |

(Continued)

OTHER PUBLICATIONS

Communication dated May 2, 2019, issued by the Taiwan Patent Office in counterpart Taiwan Application No. 10500106.

(Continued)

*Primary Examiner* — Tucker J Wright
(74) *Attorney, Agent, or Firm* — Sughrue Mion, PLLC

(57) ABSTRACT

An image sensor includes a substrate including unit pixels. Each of the unit pixels includes photoelectric conversion elements and storage diodes.

12 Claims, 21 Drawing Sheets

(56) References Cited

U.S. PATENT DOCUMENTS

| | | |
|---|---|---|
| 8,817,154 B2 | 8/2014 | Manabe et al. |
| 8,823,851 B2 | 9/2014 | Nakaoka |
| 8,854,529 B2 | 10/2014 | Yoshimura et al. |
| 8,884,348 B2 | 11/2014 | Tanaka |
| 2002/0024071 A1 | 2/2002 | Kawajiri et al. |
| 2006/0208288 A1 | 9/2006 | Hong |
| 2006/0256221 A1 | 11/2006 | McKee et al. |
| 2006/0267052 A1 | 11/2006 | McKee |
| 2007/0114629 A1 | 5/2007 | Dosluoglu et al. |
| 2008/0210986 A1 | 9/2008 | Mauritzson |
| 2010/0141631 A1 | 6/2010 | McKee |
| 2010/0208096 A1 | 8/2010 | Takeda |
| 2011/0273597 A1 | 11/2011 | Ishiwata |
| 2012/0113290 A1 | 5/2012 | Nakata et al. |
| 2012/0151215 A1 | 6/2012 | Lee et al. |
| 2012/0160906 A1 | 6/2012 | Serjeantson et al. |
| 2012/0188425 A1 | 7/2012 | Kita |
| 2012/0194696 A1 | 8/2012 | Ohshitanai et al. |
| 2012/0211804 A1 | 8/2012 | Michelot et al. |
| 2013/0057915 A1 | 3/2013 | Morizono et al. |
| 2013/0063642 A1 | 3/2013 | Nakaoka |
| 2013/0125095 A1 | 5/2013 | Claussen et al. |
| 2013/0147998 A1 | 6/2013 | Yoshimura et al. |
| 2013/0181309 A1 | 7/2013 | Jaohnson et al. |
| 2013/0228692 A1 | 9/2013 | Larsen |
| 2013/0258098 A1 | 10/2013 | Ikemoto |
| 2013/0258150 A1 | 10/2013 | Kanbe |
| 2013/0277537 A1 | 10/2013 | Altice, Jr. et al. |
| 2013/0277541 A1 | 10/2013 | Ikemoto et al. |
| 2013/0342751 A1 | 12/2013 | Yoshimura |
| 2014/0077069 A1 | 3/2014 | Tanaka |
| 2014/0085517 A1 | 3/2014 | Lenchenkov et al. |
| 2014/0211056 A1 | 7/2014 | Fan |
| 2014/0218580 A1 | 8/2014 | Mayer et al. |
| 2014/0231879 A1 | 8/2014 | Meynants et al. |
| 2015/0009383 A1* | 1/2015 | Fujii ............... H04N 5/347 348/302 |
| 2015/0350583 A1 | 12/2015 | Mauritzson et al. |

FOREIGN PATENT DOCUMENTS

| | | |
|---|---|---|
| JP | 2013-57915 A | 3/2013 |
| JP | 2013-125095 A | 6/2013 |
| JP | 2013-228692 A | 11/2013 |
| TW | 201410021 A | 3/2014 |

OTHER PUBLICATIONS

Masaki Sakakibara et al; "An 83rdB-Dynamic-Range Single-Exposure Global-Shutter CMOS Image Sensor with In-Pixel Dual Storage"; Image Sensors; Session 22; IEEE International Solid-State Circuits Conference; Feb. 22, 2012; 3 pgs. total.

\* cited by examiner

IMAGE SENSORS

CROSS-REFERENCE TO RELATED APPLICATION

This application is a continuation application of U.S. patent application Ser. No. 14/959,642 filed Dec. 4, 2015, which claims priority from Korean Patent Application No. 10-2015-0007292, filed on Jan. 15, 2015, in the Korean Intellectual Property Office, the disclosure of which is hereby incorporated by reference in its entirety.

BACKGROUND

Apparatuses consistent with exemplary embodiments relate to image sensors. More particularly, apparatuses consistent with exemplary embodiments relate to image sensors including storage gates.

An image sensor is a semiconductor device that converts an optical image into electrical signals. Image sensors may be categorized as one of charge coupled device (CCD)-type image sensors and complementary metal-oxide-semiconductor (CMOS)-type image sensors. The CMOS-type images sensors (CIS) may include a plurality of pixels that are two-dimensionally arranged, and each of the pixels may include a photodiode (PD). The photodiode may convert incident light into an electrical signal.

In order to perform applications that need higher dynamic ranges, additional gates are used to increase functional operations (e.g., an electronic shuttering operation) of the pixel.

SUMMARY

One or more exemplary embodiments may provide image sensors having improved resolution.

One or more exemplary embodiments may also provide image sensors having improved capacity of sensing a subject.

In an aspect of an exemplary embodiment, an image sensor may include a substrate including unit pixels. Each of the unit pixels may include photoelectric conversion elements and storage diodes.

An area of a photoelectric conversion element may be greater than an area of a storage diode when viewed in a plan view.

The image sensor may further include storage gates provided adjacent to portions of the substrate between the photoelectric conversion elements and the storage diodes, respectively, floating diffusion regions disposed in the substrate, and transfer gates provided adjacent to portions of the substrate between the storage diodes and the floating diffusion regions, respectively.

The storage diodes may be laterally spaced apart from the photoelectric conversion elements, respectively.

The photoelectric conversion elements may overlap with the storage diodes, respectively, when viewed in a plan view.

The substrate may include a lower substrate and an upper substrate on the lower substrate. The storage diodes may be disposed in the lower substrate, and the photoelectric conversion elements may be disposed in the upper substrate.

The image sensor may further include a connecting structure provided between the lower substrate and the upper substrate. The connecting structure may include a storage gate, and a channel region of the storage gate, the storage gate and the channel region of the storage gate being provided between a storage diode and a photoelectric conversion element.

The channel region may have a circular shape when viewed in a plan view. The storage gate may include a storage gate electrode disposed on a sidewall of the channel region to surround the sidewall of the channel region, and a storage gate insulating layer disposed between the channel region and the storage gate electrode.

The photoelectric conversion elements may define photoelectric element regions that are arranged along rows and columns, and the storage diodes may define storage element regions that are arranged along rows and columns between the photoelectric element regions.

A photoelectric element region may have an octagonal shape when viewed in a plan view, and a storage element region may have a quadrilateral shape when viewed in a plan view.

The storage element region may be surrounded by the photoelectric element regions when viewed in a plan view.

The image sensor may further include a color filter provided on the substrate corresponding to a unit pixel, and a microlens disposed on the color filter corresponding to the unit pixel.

The photoelectric conversion elements may overlap with at least a portion of microlenses, respectively, when viewed in a plan view. The storage diodes may be provided at positions corresponding to corner areas of the unit pixels.

A number of the photoelectric conversion elements may be equal to a number of the storage diodes.

In an aspect of another exemplary embodiment, an image sensor may include a substrate including unit pixels of which each includes sub-pixels, and a color filter provided on the substrate corresponding to each of the unit pixels. Each of the sub-pixels may include a photoelectric conversion element and a storage diode.

Each of the sub-pixels may further include a storage gate provided adjacent to a portion of the substrate between the photoelectric conversion element and the storage diode, a floating diffusion region disposed in the substrate, and a transfer gate provided adjacent to another portion of the substrate between the storage diode and the floating diffusion region.

An area of the photoelectric conversion element may be greater than an area of the storage diode when viewed in a plan view.

The image sensor may further include a device isolation pattern provided in the substrate to define the unit pixels and the sub-pixels.

The storage diode may be disposed on a sidewall of the photoelectric conversion element when viewed in a plan view.

The photoelectric conversion element may be disposed on a top surface of the storage diode.

Each of the sub-pixels may further include a storage gate disposed between the storage diode and the photoelectric conversion element. A channel region of the storage gate may be provided between the storage diode and the photoelectric conversion element and may have a circular shape when viewed in a plan view. The storage gate may surround a sidewall of the channel region.

The sub-pixels of one of the unit pixels may include a first sub-pixel and a second sub-pixel. The photoelectric conversion element of the first sub-pixel and the photoelectric conversion element of the second sub-pixel may define a photoelectric element region having an octagonal shape when viewed in a plan view, and the photoelectric element region may be provided between the storage diode of the first sub-pixel and the storage diode of the second sub-pixel.

The image sensor may further include a microlens provided on the color filter of a unit pixel. The microlens may cover a substantial portion of the photoelectric conversion element, and at least a portion of the storage diode may be exposed by the microlens.

The image sensor may further include a light-shielding pattern disposed between the substrate and the color filter to cover a substantial portion of the storage diode.

In an aspect of another exemplary embodiment, an image sensor may include: a pixel array including a plurality of pixels arranged in a plurality of rows and columns, wherein each pixel includes a first region in which photocharges are generated and accumulated, and a second region in which the photocharges that are generated and accumulated in the first region are transferred and stored.

The image sensor may further include: a microlens provided corresponding to a pixel and disposed above the pixel array, wherein the microlens overlaps with the first region of the corresponding pixel.

The image sensor may further include: a color filter including a plurality of color elements corresponding to the pixel and disposed between the microlens and the pixel array; and a sub-micro lens disposed between the color filter and the pixel array, wherein the sub-micro lens covers the first region and does not cover the second region of the corresponding pixel.

The each pixel includes photoelectric conversion elements to define the first region and storage diodes to define the second region, wherein a storage diode is spaced apart from photoelectric conversion element in a direction perpendicular to a direction extending from the pixel array to the microlens.

The each pixel includes photoelectric conversion elements to define the first region and storage diodes to define the second region, wherein a storage diode overlap with a photoelectric conversion element in a direction extending from the pixel array to the microlens.

BRIEF DESCRIPTION OF THE DRAWINGS

The above and/or other aspects will become more apparent by describing certain exemplary embodiments with reference to the accompanying drawings in which.

DETAILED DESCRIPTION

Figure 1:
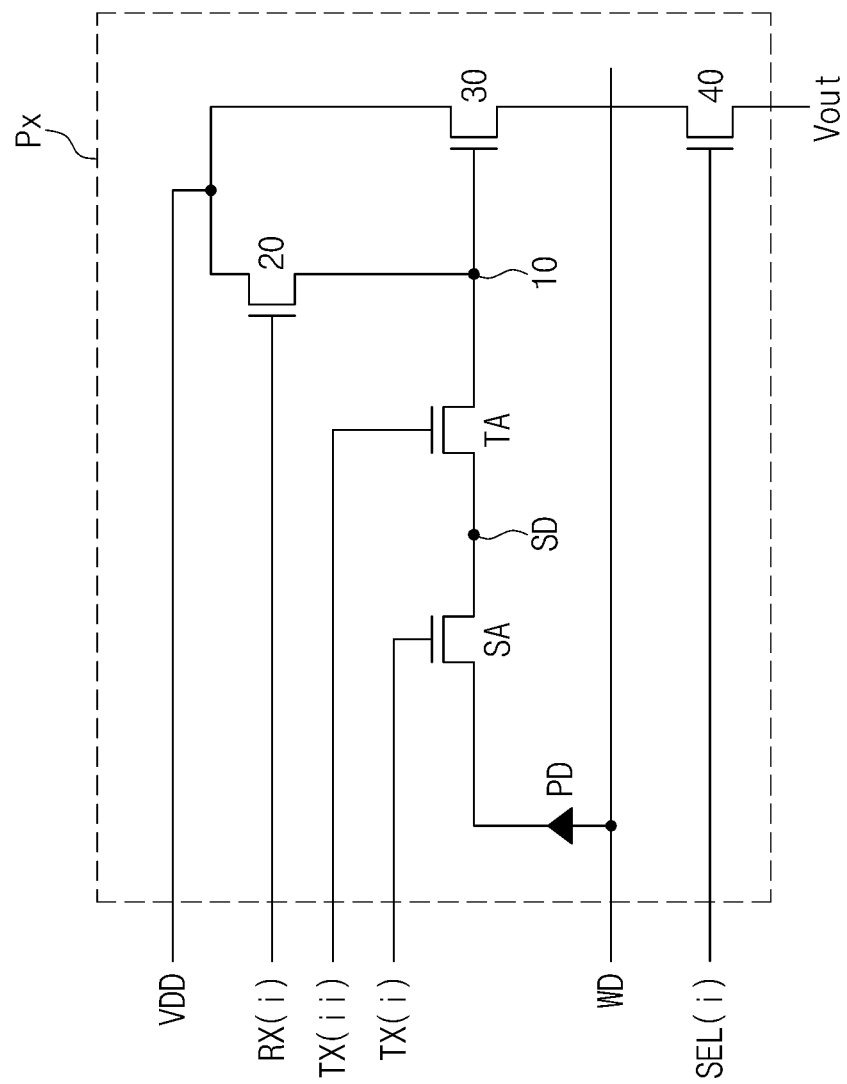
FIG. 1 is a circuit diagram of an active pixel sensor array of an image sensor according to an exemplary embodiment.

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, the exemplary embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the exemplary embodiment in the detailed description will be described with sectional views as ideal exemplary views of the inventive concepts. Accordingly, shapes of the exemplary views may be modified according to manufacturing techniques and/or allowable errors. Therefore, the exemplary embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of exemplary embodiments.

As appreciated by the present inventive entity, devices and methods of forming devices according to various exemplary embodiments described herein may be embodied in microelectronic devices such as integrated circuits, wherein a plurality of devices according to various exemplary embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various exemplary embodiments described herein may include a plurality of the devices in an array and/or in a two-dimensional pattern that is based on the functionality of the microelectronic device.

The devices according to various exemplary embodiments described herein may be interspersed among other devices depending on the functionality of the microelectronic device. Moreover, microelectronic devices according to various exemplary embodiments described herein may be replicated in a third direction that may be orthogonal to the two different directions, to provide three-dimensional integrated circuits.

Accordingly, the cross-sectional view(s) illustrated herein provide support for a plurality of devices according to various exemplary embodiments described herein that extend along two different directions in a plan view and/or in three different directions in a perspective view.

FIG. 1 is a circuit diagram of an active pixel sensor array of an image sensor according to an exemplary embodiment.

Referring to FIG. 1, a unit pixel of an active pixel sensor array may include sub-pixels Pox, and each of the sub-pixels Pox may include five N-type metal-oxide-semiconductor (NMOS) transistors. Each of the sub-pixels Pox may include a photoelectric conversion element PD that receives light to generate and accumulate photo-charges, and sensing elements that sense an optical signal incident on the photoelectric conversion element PD. The sensing elements may include a storage element SA, a transfer element TA, a reset element 20, an amplification element 30, and a selection element 40. The elements SA, TA, 20, 30, and 40 may correspond to the NMOS transistors.

The photoelectric conversion element PD may generate and accumulate charges corresponding to the incident light. For example, the photoelectric conversion element PD may include a photo diode, a photo transistor, a photo gate, a pinned photo diode (PPD), or any combination thereof.

The photoelectric conversion element PD may be connected to the storage element SA. The storage element SA may transfer the charges that are generated and accumulated in the photoelectric conversion element PD to a storage diode SD. The storage element SA may include a storage gate SG// to be described later. The storage element SA may be connected to the transfer element TA that transfers the charges to a detection element 10.

The storage diode SD may receive the charges accumulated in the photoelectric conversion element PD. A charge storing capacity of the storage diode SD may be greater than that of the photoelectric conversion element PD, so that the charges generated and accumulated in the photoelectric conversion element PD may be transferred to the storage diode SD at once.

The charges accumulated in the storage diode SD may be transferred to the detection element 10 through the transfer element TA. The transfer element TA may include a transfer gate TG// to be described later. The detection element 10 may be a floating diffusion region (FD). A charge storing capacity of the detection element 10 may be greater than that of the storage diode SD, so that the charges may be cumulatively stored in the detection element 10. In other words, the charges stored in the storage diode SD may be transferred to the detection element 10 at once. As a result, the charges generated in the photoelectric conversion element PD may be transferred to the detection element 10 through the storage diode SD at once, and thus, it is possible to avoid an image distortion which may be caused by a transfer time delay when charges are sequentially transferred to the detection element 10. The detection element 10 may be electrically connected to the amplification element 30 to control the amplification element 30.

The reset element 20 may be used to periodically reset the detection element 10. A source of the reset element 20 may be connected to the detection element 10, and a drain of the reset element 20 may be connected to a power voltage VDD. In addition, the reset element 20 may be driven by a bias provided by a reset signal RX(i). If the reset element 20 is turned-on by the bias provided by the reset signal RX(i), the power voltage VDD connected to the drain of the reset element 20 may be transferred to the detection element 10. Thus, the detection element 10 may be reset when the reset element 20 is turned-on.

The amplification element 30 may be operated in association with a constant current source (not shown) disposed outside the sub-pixels Px to serve as a source follower buffer amplifier. The amplification element 30 may amplify a variation in electrical potential of the detection element 10, and the amplified signal may be outputted through an output line Vout.

Even though not shown in the drawings, an active contact (not shown) may be disposed between the reset element 20 and the amplification element 30. The active contact may apply a voltage to the unit pixel.

The selection element 40 may select the unit pixels of a selected row. The selection element 40 may be driven by a bias provided by a row selection line SEL(i). If the selection element 40 is turned-on, the power voltage VDD connected to the drain of the amplification element 30 may be transmitted to the drain of the selection element 40.

Driving signal lines TX(i), TX(ii), RX(i) and SEL(i) of the storage element SA, the transfer element TA, the reset element 20 and the selection element 40 may extend in a row direction (e.g., a horizontal direction) to drive the unit pixels of the same row at the same time.

The sub-pixel Px may be provided in plurality in each of the unit pixels. The reset element 20, the amplification element 30, and the selection element 40 may be shared by the sub-pixels Px adjacent to each other, so that an integration density of the image sensor may be improved.

Figure 2A:
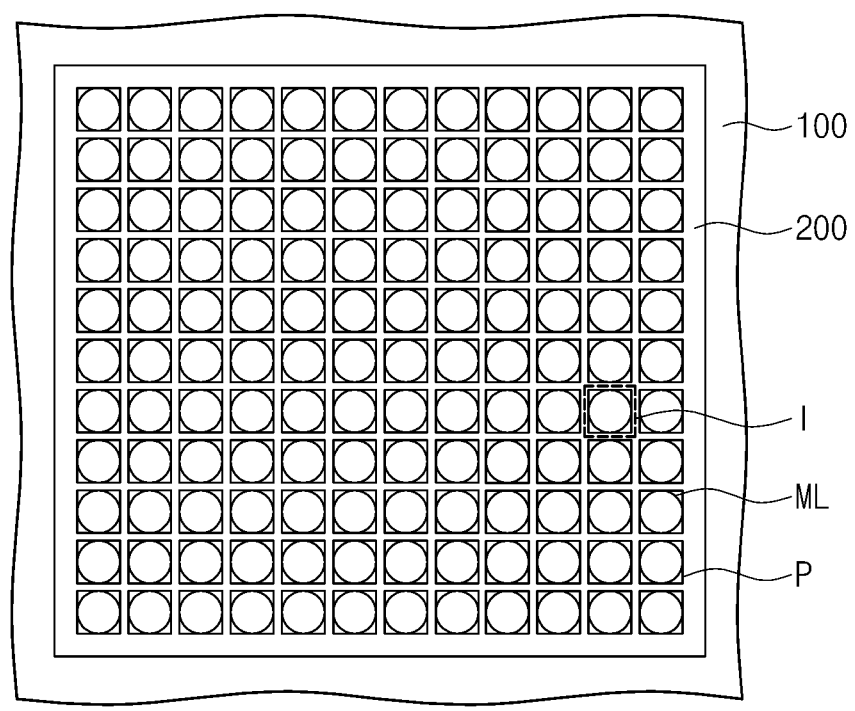
FIG. 2A is a plan view illustrating an image sensor according to an exemplary embodiment.
Figure 2B:
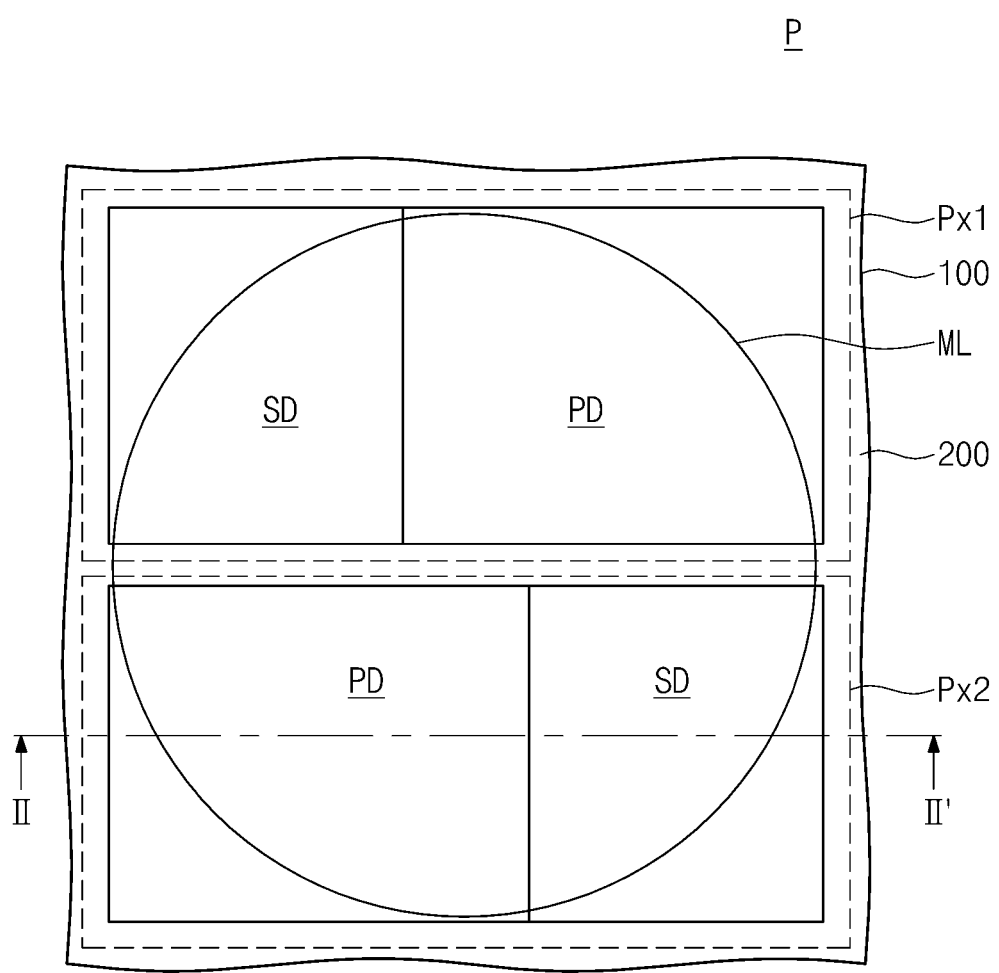
FIG. 2B is an enlarged view of a region 'I' of FIG. 2A to illustrate a unit pixel of an image sensor according to an exemplary embodiment.
Figure 2C:
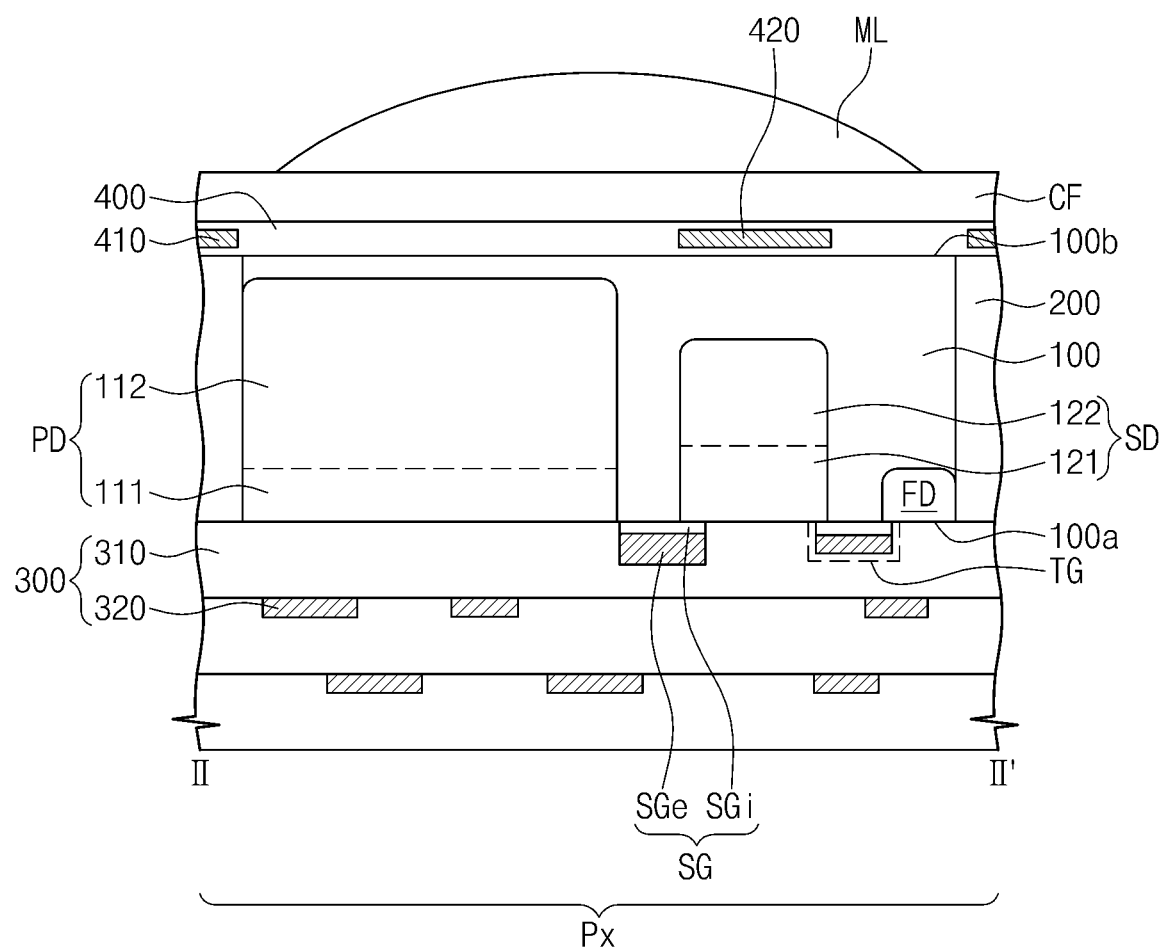
FIG. 2C is a cross-sectional view taken along a line II-II' of FIG. 2B.

FIG. 2A is a plan view illustrating an image sensor according to an exemplary embodiment. FIG. 2B is an enlarged view of a region 'I' of FIG. 2A to illustrate a unit pixel of an image sensor according to an exemplary embodiment. FIG. 2C is a cross-sectional view taken along a line II-II' of FIG. 2B.

Referring to FIGS. 2A to 2C, a substrate 100 of the image sensor 1 may include unit pixels P. Each of the unit pixels P may output an electrical signal. Each of the unit pixels P may include a plurality of sub-pixels Px1 and Px2. The unit pixels P and the sub-pixels Px1 and Px2 may be defined by a device isolation pattern 200. Each of the unit pixels P may include some sensing elements 20, 30 and 40 of FIG. 1, or the some sensing elements 20, 30 and 40 may be shared by the unit pixels P that are adjacent to each other. Hereinafter, a structure and a function of the image sensor 1 will be described in more detail with reference to FIG. 2C. Here, a single unit pixel P and a single sub-pixel Px will be mainly described.

The substrate 100 may have a first surface 100a and a second surface 100b opposite to each other. The first surface 100a may correspond to a front side of the substrate 100, and the second surface 100b may correspond to a back side of the substrate 100. For example, the substrate 100 may be a semiconductor substrate or a silicon-on-insulator (SOI) substrate. The substrate 100 may be doped with P-type dopants. Each of the sub-pixels Px of the image sensor 1 may include the device isolation pattern 200, a photoelectric conversion element PD, a storage gate SG, a storage diode SD, a transfer gate TG, a floating diffusion region FD, an interconnection structure 300, and a light-shielding pattern 420.

The device isolation pattern 200 may define the unit pixel P and the sub-pixel Px, as described above. In an exemplary embodiment, the device isolation pattern 200 may penetrate the substrate 100 to connect the first surface 100a of the substrate 100 to the second surface 100b of the substrate 100. However, the inventive concepts are not limited thereto. The device isolation pattern 200 may be a deep-trench isolation (DTI) pattern. For example, the device isolation pattern 200 may include an insulating material provided in a trench or a via. In this case, the device isolation pattern 200 may include an insulating material of which a refractive index is lower than that of the substrate 100. In another exemplary embodiment, the device isolation pattern 200 may be a dopant region that is formed by doping a portion of the substrate 100 with dopants.

The photoelectric conversion element PD may be disposed in the substrate 100. The photoelectric conversion element PD may include a first dopant region 111 and a second dopant region 112. The first dopant region 111 may be provided to be adjacent to the first surface 100a of the substrate 100. For example, the first dopant region 111 may be a region doped with P-type dopants. The second dopant region 112 may be disposed at a deeper position from the first surface 100a of the substrate 100, compared to the first dopant region 111, and may be, for example, a region doped with N-type dopants.

The storage gate SG may be provided on the first surface 100a of the substrate 100. The storage gate SG may be disposed at a side of the photoelectric conversion element PD. The storage gate SG may include a storage gate electrode SGe and a storage gate insulating layer SGi. The storage gate SG may have a flat-type structure disposed on the first surface 100a of the substrate 100. Alternatively, the storage gate SG may have a buried-type structure extending from the first surface 100a of the substrate 100 into the substrate 100.

The storage diode SD may be provided in the substrate 100 at a side of the storage gate SG and may be spaced apart from the photoelectric conversion element PD in a horizontal direction. The storage gate SG may be provided on the substrate 100 between the photoelectric conversion element PD and the storage diode SD to transfer charges generated and accumulated in the photoelectric conversion element PD to the storage diode SD. The storage diode SD may store the charges transferred by the storage gate SG. A charge storing capacity of the storage diode SD may be greater than that of the photoelectric conversion element PD. The storage diode SD may include a first doped region 121 and a second doped region 122. The second doped region 122 may be disposed at a deeper position from the first surface 100a of the substrate 100, compared to the first doped region 121. The second doped region 122 may be doped with dopants of the same conductivity type as the dopants of the first dopant region 111. For example, the second doped region 122 may be doped with P-type dopants. The first doped region 121 may be adjacent to the first surface 100a of the substrate 100. The first doped region 121 may be doped with dopants of a conductivity type different from that of the dopants of the second doped region 122. For example, the first doped region 121 may be doped with N-type dopants.

The transfer gate TG may be spaced apart from the storage gate SG on the first surface 100a of the substrate 100. The transfer gate TG may have a flat-type structure or a buried-type structure.

The floating diffusion region FD may be provided in the substrate 100 and may be adjacent to the first surface 100a of the substrate 100. The floating diffusion region FD may be disposed at a side of the storage diode SD. For example, the floating diffusion region FD may be a region doped with N-type dopants. The transfer gate TG may be provided between the storage diode SD and the floating diffusion region FD to transfer the charges stored in the storage diode SD to the floating diffusion region FD. A charge storing capacity of the floating diffusion region FD may be greater than that of the storage diode SD. Since the storage diode SD is provided, the charges generated and accumulated in the photoelectric conversion element PD may be transferred to the floating diffusion region FD at once. As a result, when a subject is photographed by using the image sensor 1, image distortion caused by a transfer time delay of charges may be reduced or prevented even when the subject moves.

The interconnection structure 300 may be disposed on the first surface 100*a* of the substrate 100. The interconnection structure 300 may include interlayer insulating layers 310 and interconnections 320. In another exemplary embodiment, the interconnection structure 300 may be disposed on the second surface 100*b* of the substrate 100.

A buffer layer 400 may be disposed on the second surface 100*b* of the substrate 100. The buffer layer 400 may serve as a planarization layer, an anti-reflection layer, and/or a passivation layer. A grid pattern 410 may be provided on the device isolation pattern 200 in the buffer layer 400. In other words, the grid pattern 410 may overlap with the device isolation pattern 200 in a vertical direction. In another exemplary embodiment, the grid pattern 410 may be omitted.

The light-shielding pattern 420 may be disposed on the second surface 100*b* of the substrate 100. The light-shielding pattern 420 may be provided in the buffer layer 400. The light-shielding pattern 420 may cover the storage diode SD but may not cover the photoelectric conversion element PD. The light-shielding pattern 420 may include a metal. The light-shielding pattern 420 may prevent light from being incident on the storage diode SD through the second surface 100*b* of the substrate, and thus, it is possible to reduce or prevent a phenomenon that a signal of the charges stored in the storage diode SD is affected by the incident light.

Referring to FIGS. 2A and 2C, a color filter CF and a microlens ML may be disposed on the buffer layer 400 of each of the unit pixels P. The color filters CF may be arranged in a matrix form to constitute a color filter array. In an exemplary embodiment, the color filter array may have a Bayer pattern including a red filter, a green filter, and a blue filter. In another exemplary embodiment, the color filter array may include a yellower filter, a magenta filter, and a cyan filter.

As illustrated in FIG. 2B, the unit pixel P may include a plurality of the photoelectric conversion elements PD. The photoelectric conversion elements PD included in the same unit pixel P may share the color filter CF and the microlens ML. Electrical signals outputted from one unit pixel P may be electrical signals of the same color light.

The sub-pixel Px may include the photoelectric conversion element PD and the storage diode SD. An area of the photoelectric conversion element PD may be greater than that of the storage diode SD when viewed from a plan view. A full well capacity (FWC) of the photoelectric conversion element PD may be increased, so that the image quality of the image sensor 1 may be improved. In another exemplary embodiment, a height of the photoelectric conversion element PD illustrated in FIG. 2C may be increased, so that a volume of the photoelectric conversion element PD may be increased. Thus, while the sub-pixel Px includes the storage diode SD, it is possible to minimize or prevent a reduction of the full well capacity of the photoelectric conversion element PD.

A focus correction function of the image sensor will be described hereinafter.

As illustrated in FIGS. 2A and 2B, the image sensor 1 may not include an additional focus-detecting pixel (not shown).

Here, the focus-detecting pixel may be a pixel that performs a function of correcting a focus of the unit pixel P but does not generate a signal corresponding to an image of a subject. If the number of the focus-detecting pixels increases, the number of the unit pixels P that generate the electrical signals may be reduced. Since the image sensor 1 does not include the focus-detecting pixel, the resolution of the image sensor 1 may be improved. One unit pixel P will be described in detail hereinafter.

As illustrated in FIG. 2B, in the unit pixel P, the photoelectric conversion elements PD may be spaced apart from each other in a plan view, so that lights incident on the photoelectric conversion elements PD may have phases different from each other. A focus of a photographed image may be corrected by using a phase difference between images obtained from the photoelectric conversion elements PD. The image sensor 1 may obtain three-dimensional (3D) depth information of a subject. According to an exemplary embodiment, the unit pixel P may include the plurality of photoelectric conversion elements PD, and thus, the image sensor 1 may perform the focus correction function of the subject without an additional focus-detecting pixel.

As the photoelectric conversion elements PD are disposed farther away from each other in the unit pixel P, a phase difference between the lights incident on the photoelectric conversion elements PD may increase. According to an exemplary embodiment, the photoelectric conversion elements PD may be arranged in a diagonal direction, and thus, the phase difference between the lights may increase. In other words, the phase difference between lights incident on the photoelectric conversion elements PD arranged in the diagonal direction may be greater than a phase difference between lights incident on photoelectric conversion elements adjacent to each other in a transverse or longitudinal direction.

For example, the photoelectric conversion elements PD may be disposed to be adjacent to the storage diodes SD. In other words, the storage diodes SD may be disposed on sidewalls of the photoelectric conversion elements PD. Thus, the image sensor 1 may perform a more improved focus correction function. However, the inventive concepts are not limited to the above mentioned planar arrangement of the photoelectric conversion elements PD.

Figure 2D:
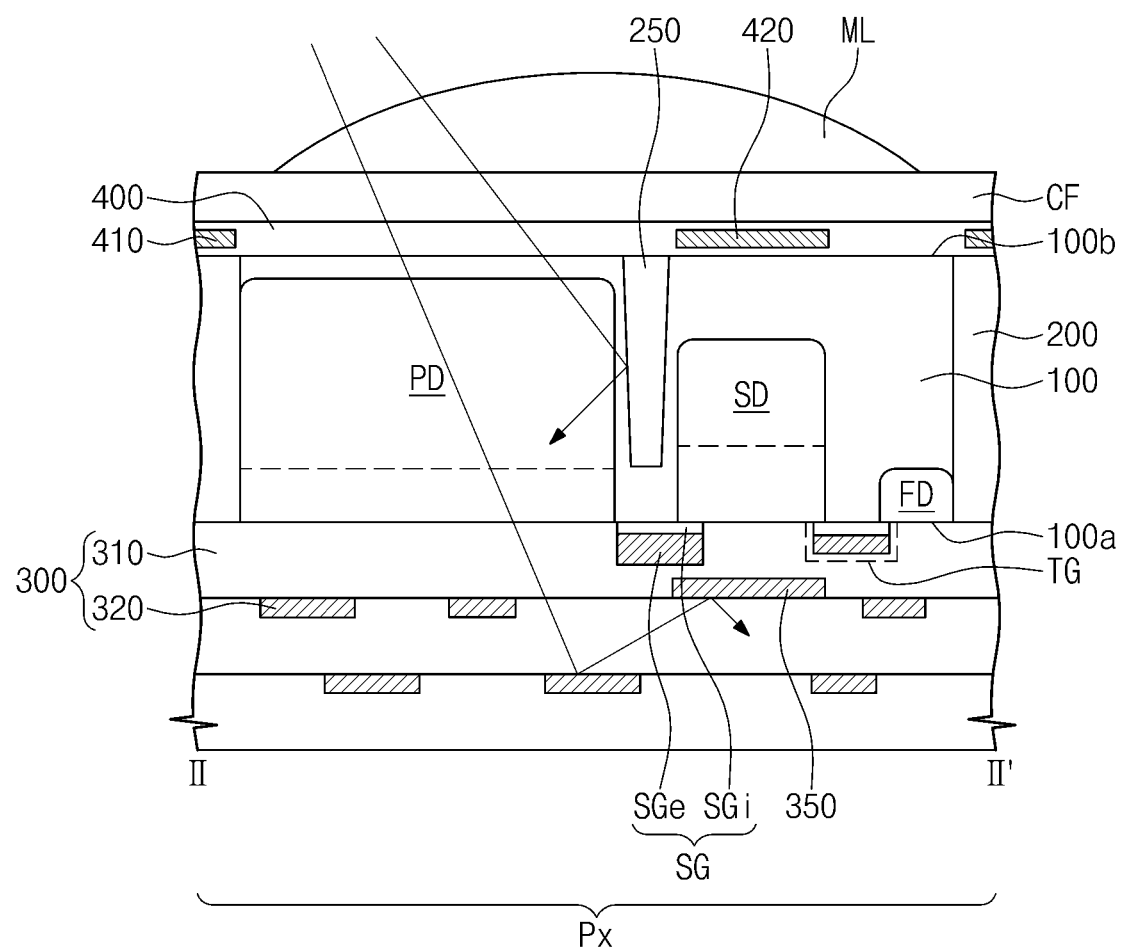
FIG. 2D is a cross-sectional view corresponding to the line II-II' of FIG. 2B to illustrate an image sensor according to another exemplary embodiment.

FIG. 2D is a cross-sectional view corresponding to the line II-II' of FIG. 2B to illustrate an image sensor according to another exemplary embodiment. Hereinafter, the descriptions of the same elements as described above will be omitted or briefly mentioned to avoid duplicate explanation.

Referring to FIGS. 2B and 2D, a sub-pixel Px of an image sensor 2 may include a device isolation pattern 200, a photoelectric conversion element PD, a storage gate SG, a storage diode SD, a transfer gate TG, a floating diffusion region FD, an interconnection structure 300, and a light-shielding pattern 420. A substrate 100, the device isolation pattern 200, the photoelectric conversion element PD, the storage gate SG, the storage diode SD, the transfer gate TG, the floating diffusion region FD, the interconnection structure 300, the light-shielding pattern 420, a color filter CF, and a microlens ML of the image sensor 2 may be similar to or the same as the elements that have been described with reference to FIG. 2C. For example, the light-shielding pattern 420 may be provided on the second surface 100*b* of the substrate 100 and may cover the storage diode SD. The light-shielding pattern 420 may prevent light from being incident on the storage diode SD. The color filter CF and the microlens ML may be disposed on the second surface 100*b* of the substrate 100.

A device isolation layer 250 may be disposed in a trench recessed from the second surface 100b of the substrate 100. The device isolation layer 250 may be disposed between the photoelectric conversion element PD and the storage diode SD in the substrate 100. The device isolation layer 250 may include an insulating material of which a refractive index is lower than that of the substrate 100. As shown in light paths represented by arrows illustrated in FIG. 2D, light incident from the second surface 100b on the photoelectric conversion element PD may be totally reflected by the device isolation layer 250, and thus, it is possible to prevent the light from being incident on the storage diode SD or to reduce the amount of the light incident on the storage diode SD. A bottom surface of the device isolation layer 250 may be spaced apart from the first surface 100a of the substrate 100, so that charges accumulated in the photoelectric conversion element PD may be transferred to the storage diode SD through the substrate 100.

An assistant light-shielding pattern 350 may be provided with respect to the first surface 100a of the substrate 100 to cover a bottom surface of the storage diode SD. A distance between the assistant light-shielding pattern 350 and the first surface 100a of the substrate 100 may be smaller than those between the first surface 100a and the interconnections 320. Light incident on the photoelectric conversion element PD may pass through the photoelectric conversion element PD and may be reflected by the interconnections 320. The assistant light-shielding pattern 350 may prevent the light reflected by the interconnections 320 from being incident on the storage diode SD through the first surface 100a of the substrate 100. For example, the assistant light-shielding pattern 350 may include a metal.

In another exemplary embodiment, some or all of the device isolation layer 250 and the assistant light-shielding pattern 350 may be omitted.

Figure 3A:
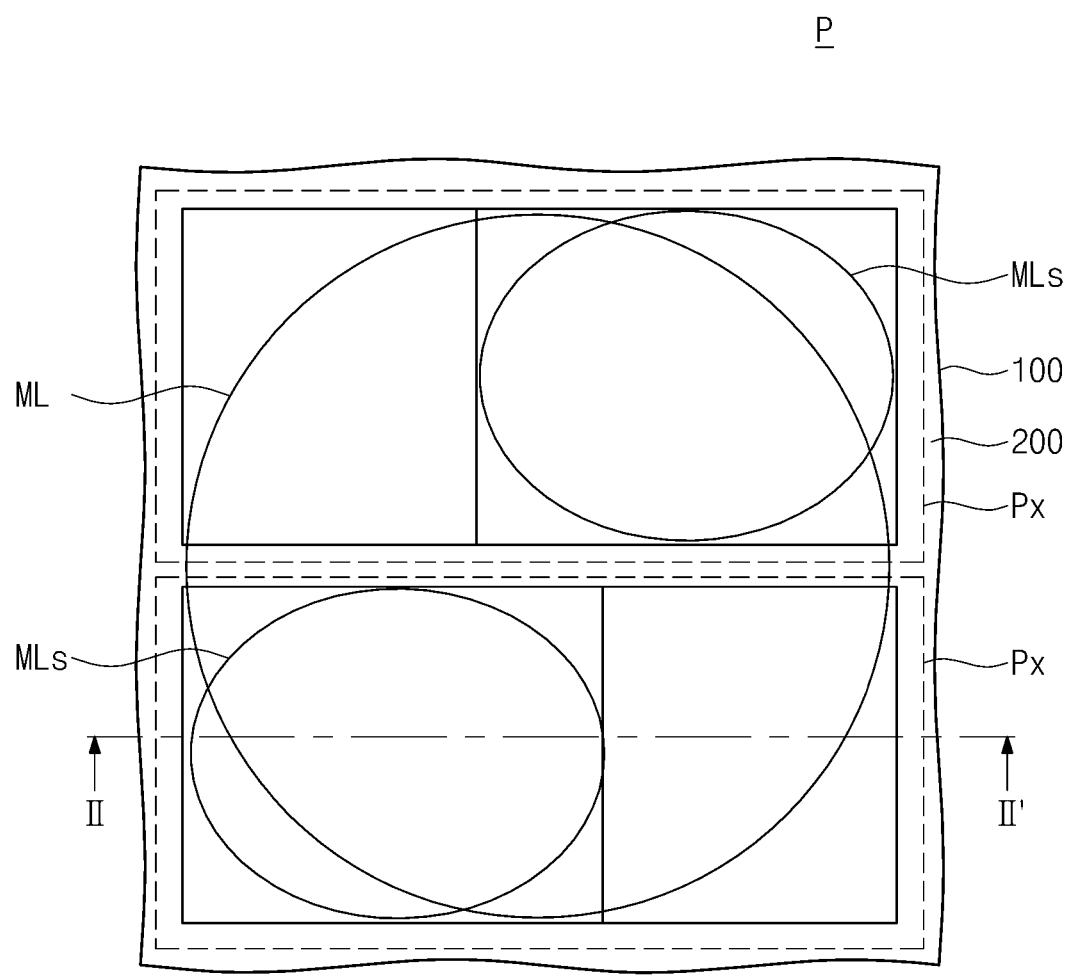
FIG. 3A is a plan view illustrating an image sensor according to another exemplary embodiment.
Figure 3B:
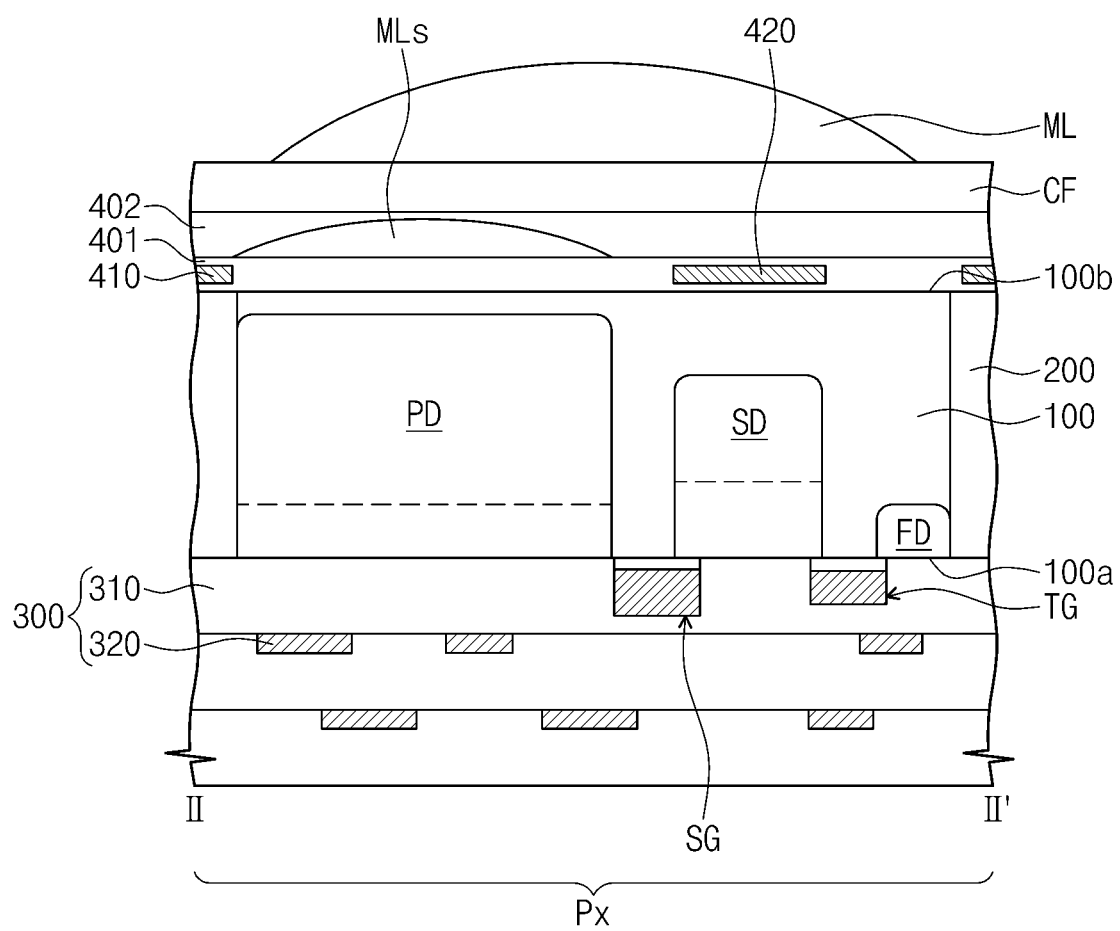
FIG. 3B is a cross-sectional view taken along a line II-II' of FIG. 3A.

FIG. 3A is a plan view corresponding to the region 'I' of FIG. 2A to illustrate an image sensor according to another exemplary embodiment. FIG. 3B is a cross-sectional view taken along a line II-II' of FIG. 3A.

Referring to FIGS. 3A and 3B, a sub-pixel Px of an image sensor may include a device isolation pattern 200, a photoelectric conversion element PD, a storage gate SG, a storage diode SD, a transfer gate TG, a floating diffusion region FD, an interconnection structure 300, and a light-shielding pattern 420. A color filter CF and a microlens ML may be disposed on the second surface 100b of a substrate 100. The substrate 100, the device isolation pattern 200, the photoelectric conversion element PD, the storage gate SG, the storage diode SD, the transfer gate TG, the floating diffusion region FD, the interconnection structure 300, the light-shielding pattern 420, the color filter CF, and the microlens ML may be similar to or the same as the corresponding elements that have been described with reference to FIG. 2C.

A first buffer layer 401 may be disposed on the second surface 100b of the substrate 100. The first buffer layer 401 may be the same as the buffer layer 400 described with reference to FIG. 2C. For example, the first buffer layer 401 may include the grid pattern 410 and the light-shielding pattern 420. A second buffer layer 402 may be disposed on the first buffer layer 401. In an exemplary embodiment, the second buffer layer 402 may function as a planarization layer. However, the inventive concepts are not limited thereto.

As illustrated in FIG. 3A, a sub-microlens MLs may be disposed on the photoelectric conversion element PD in each of the sub-pixels Px. The sub-microlens MLs may overlap with the photoelectric conversion element PD when viewed from a plan view. Referring to FIG. 3B, the sub-microlens MLs may be disposed in the second buffer layer 402 on the second surface 100b of the substrate 100. The sub-microlens MLs may cover the photoelectric conversion element PD, and thus, the amount of light incident on the photoelectric conversion element PD may be increased. In another exemplary embodiment, the second buffer layer 402 and the sub-microlens MLs may be provided between the substrate 100 and the first buffer layer 401.

Figure 4A:
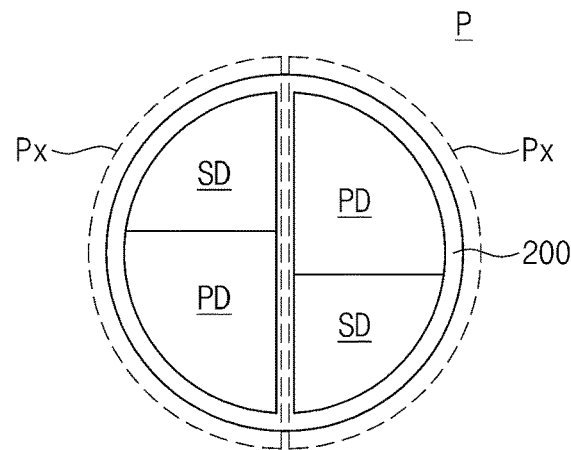
FIGS. 4A to 4C are plan views illustrating unit pixels of image sensors according to still other exemplary embodiments.
Figure 4B:
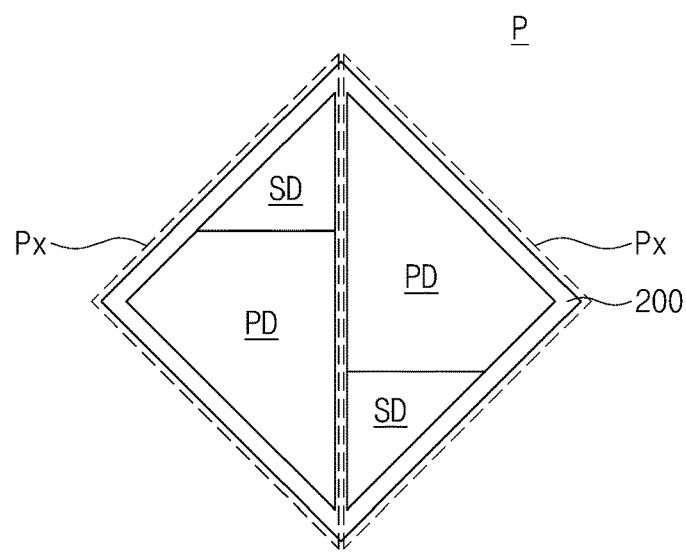
Figure 4C:
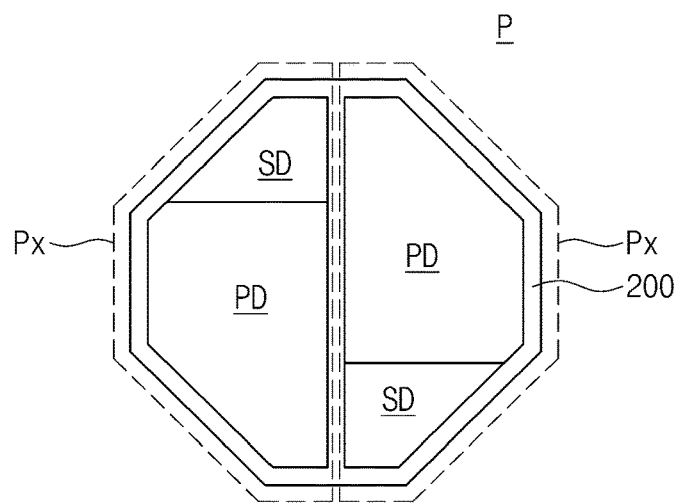

FIGS. 4A to 4C are plan views corresponding to the region 'I' of FIG. 2A to illustrate unit pixels of image sensors according to still other exemplary embodiments. Hereinafter, the description of the same elements as described above will be omitted or briefly mentioned to avoid duplicate explanation. According to an exemplary embodiment, a unit pixel P including a plurality of sub-pixels will be described.

Referring to FIGS. 4A, 4B, and 4C, a device isolation pattern 200 may define a unit pixel P and sub-pixels Px. Shapes of the unit pixel P and the sub-pixels Px may be various when viewed from a plan view. For example, the unit pixel P may have a circular shape as illustrated in FIG. 4A, a diamond shape as illustrated in FIG. 4B, or an octagonal shape as illustrated in FIG. 4C. However, the inventive concepts are not limited to the shapes of the unit pixels P illustrated in FIGS. 4A to 4C. In other words, the unit pixel P may have one of other planar shapes. In addition, the planar shapes of the sub-pixels Px may be variously modified.

Each of the sub-pixels Px may include the photoelectric conversion element PD and the storage diode SD. As described above, an area of the photoelectric conversion element PD may be greater than that of the storage diode SD. However, the inventive concepts are not limited thereto. In one unit pixel P, the photoelectric conversion element PD of one of the sub-pixels Px may be spaced apart from the photoelectric conversion element PD of another one of the sub-pixels Px. For example, the storage diode SD of another one of the sub-pixels Px may be disposed on a sidewall of the photoelectric conversion element PD of the one of the sub-pixels Px.

Figure 5A:
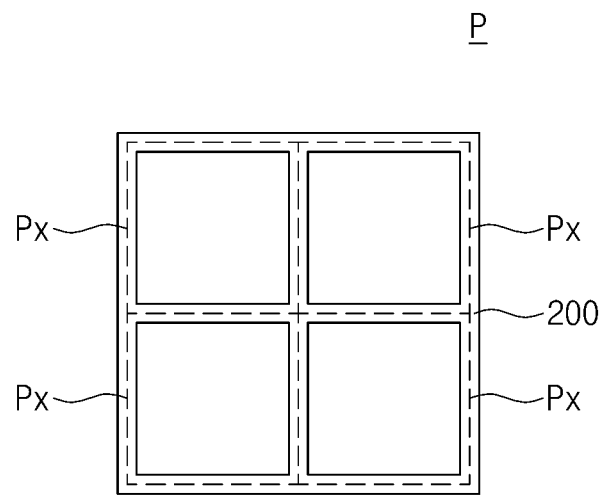
FIGS. 5A and 5B are plan views illustrating unit pixels of image sensors according to yet still other exemplary embodiments.
Figure 5B:
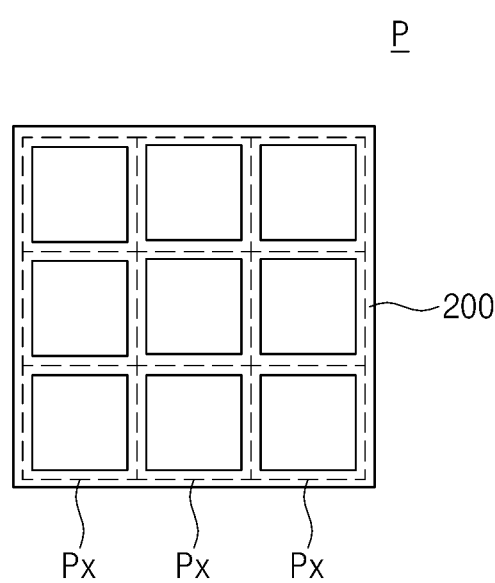

FIGS. 5A and 5B are plan views corresponding to the region 'I' of FIG. 2A to illustrate unit pixels of image sensors according to yet still other exemplary embodiments. Hereinafter, descriptions of the same elements as described above will be omitted or briefly mentioned to avoid duplicate explanation.

Referring to FIGS. 5A and 5B, a device isolation pattern 200 may define a unit pixel P and sub-pixels Px. The unit pixel P may include a plurality of the sub-pixels Px. Here, the number of the sub-pixels Px in the unit pixel P may be various. For example, the unit pixel P may have four sub-pixels Px as illustrated in FIG. 5A or nine sub-pixels Px as illustrated in FIG. 5B.

Figure 6A:
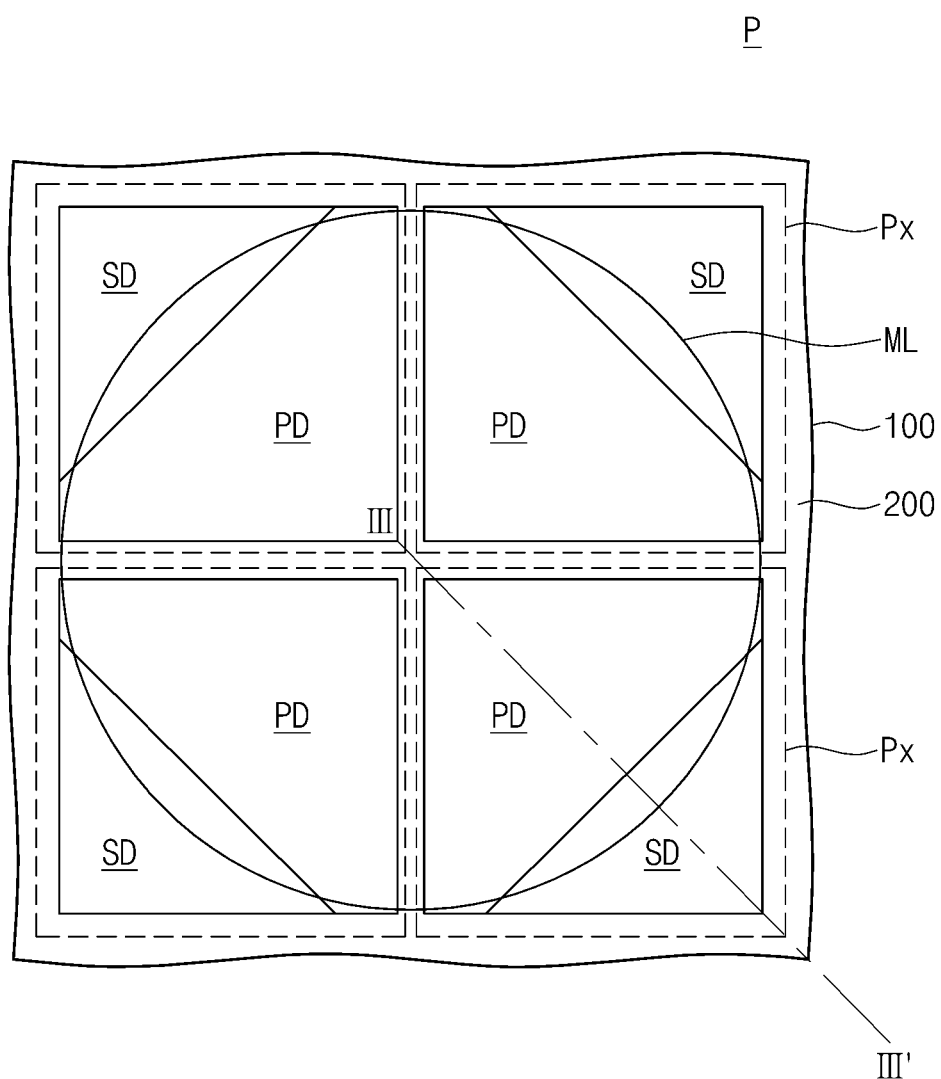
FIG. 6A is a plan view illustrating a unit pixel of an image sensor according to yet still another exemplary embodiments.
Figure 6B:
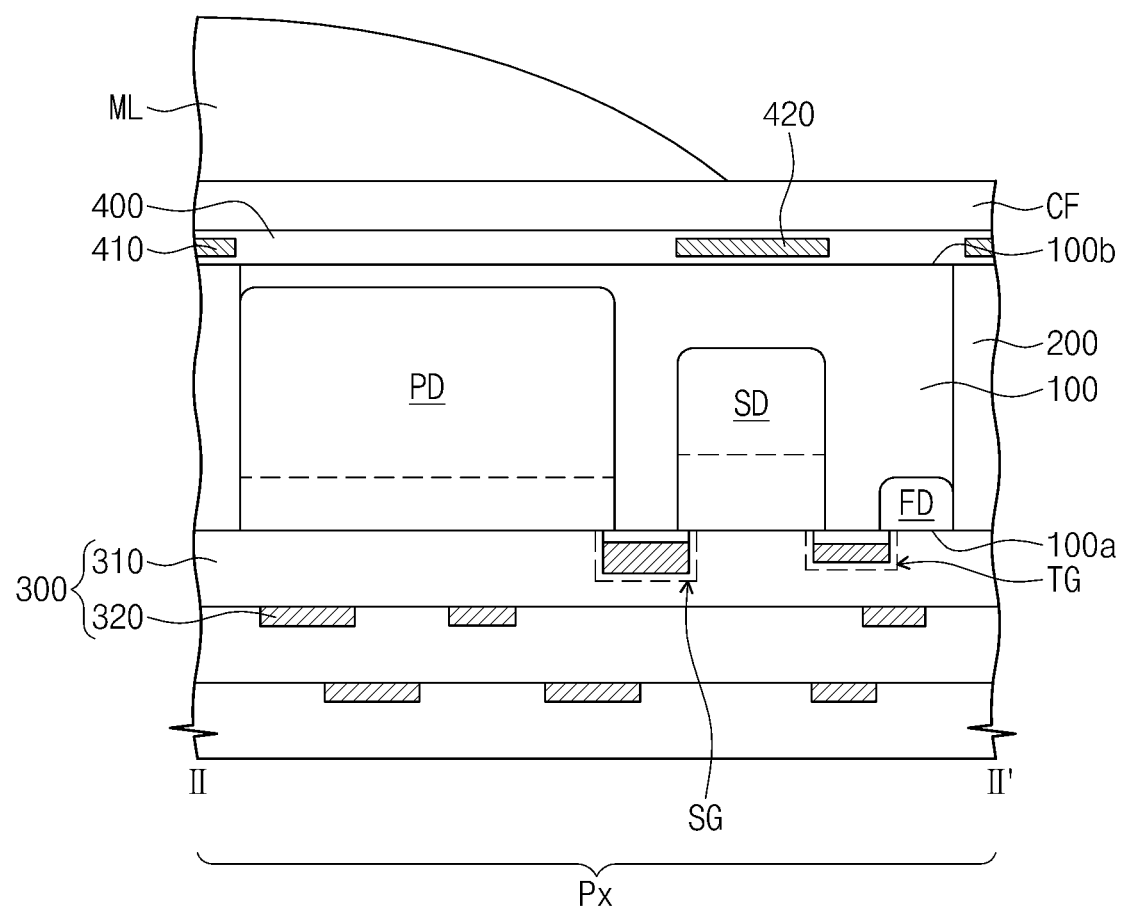
FIG. 6B is a cross-sectional view taken along a line III-III' of FIG. 6A.

FIG. 6A is a plan view corresponding to the region 'I' of FIG. 2A to illustrate a unit pixel of an image sensor according to yet still another exemplary embodiment. FIG. 6B is a cross-sectional view taken along a line III-III' of FIG. 6A. Hereinafter, the descriptions of the same elements as described above will be omitted or briefly mentioned to avoid duplicate explanation.

Referring to FIG. 6A, a substrate 100 of an image sensor may have a unit pixel P. The unit pixel P may include a plurality of sub-pixels Px. Each of the sub-pixels Px may include a photoelectric conversion element PD and a storage diode SD. The unit pixels P and the sub-pixels Px may be defined by a device isolation pattern 200. Hereinafter, a single unit pixel p and a single sub-pixel Px will be described.

A microlens ML may be disposed on the unit pixel P of the substrate 100. The microlens ML may cover the photoelectric conversion element PD of the unit pixel P. The photoelectric conversion element PD may overlap with the microlens ML when viewed from a plan view. An overlapping area of the photoelectric conversion element PD and the microlens ML may be increased, so that the mount of light incident on the photoelectric conversion element PD may be more increased.

The storage diode SD may be disposed at a position corresponding to a corner of the unit pixel P. The microlens ML may not cover at least a portion of the storage diode SD. For example, at least a portion of the storage diode SD may not overlap with the microlens ML when viewed from a plan view. An area of the photoelectric conversion element PD may be greater than that of the storage diode SD.

Referring to FIG. 6B, each of the sub-pixels Px of the image sensor may include the device isolation pattern 200, the photoelectric conversion element PD, the storage gate SG, the storage diode SD, the transfer gate TG, the floating diffusion region FD, the interconnection structure 300, the light-shielding pattern 420, the color filter CF, and the microlens ML. The substrate 100, the device isolation pattern 200, the photoelectric conversion element PD, the storage gate SG, the storage diode SD, the transfer gate TG, the floating diffusion region FD, the interconnection structure 300, the light-shielding pattern 420, and the color filter CF may be similar to or the same as the corresponding elements that have been described with reference to FIG. 2C.

Figure 7A:
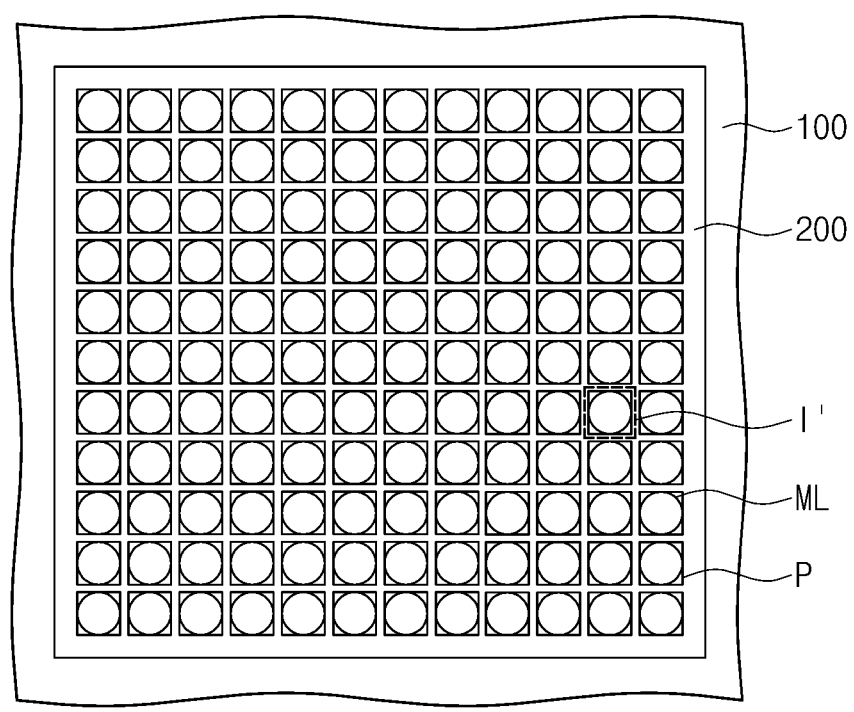
FIG. 7A is a plan view illustrating an image sensor according to yet still another exemplary embodiment.
Figure 7B:
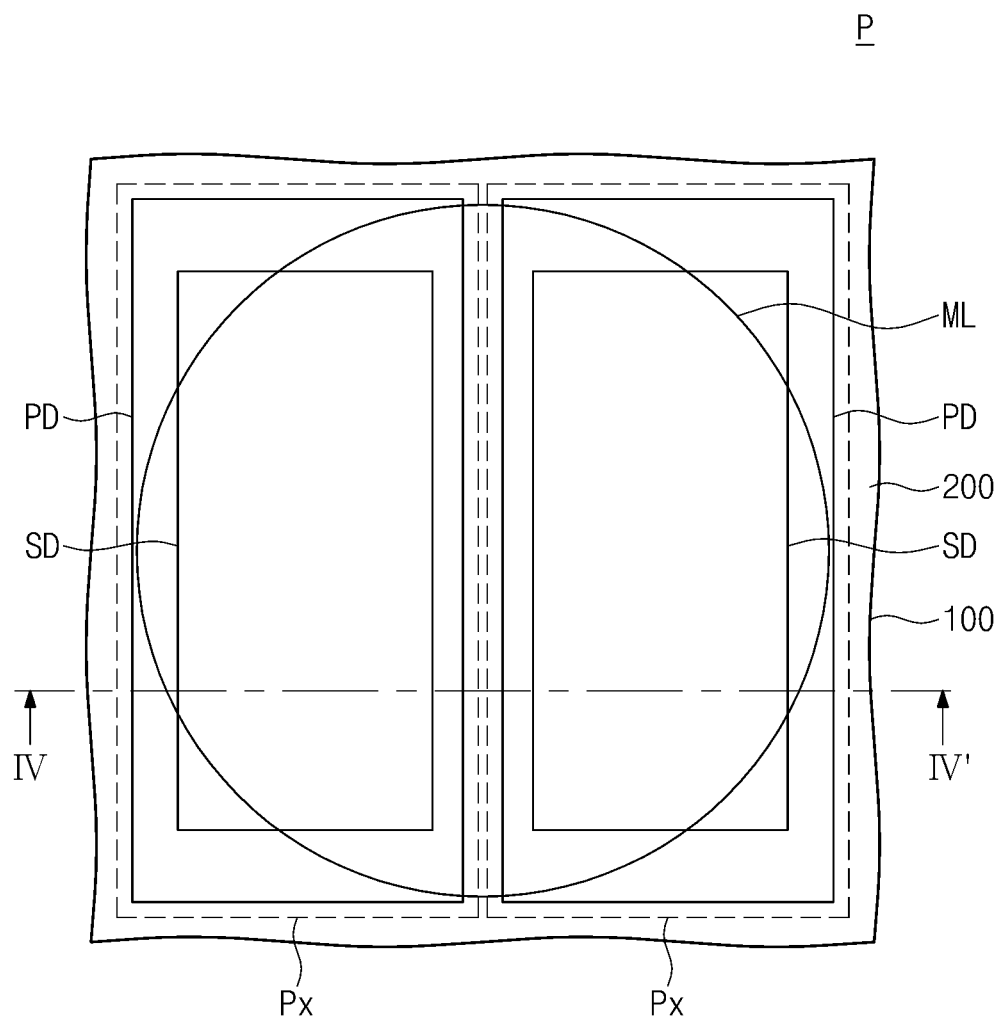
FIG. 7B is an enlarged view of a region 'I' of FIG. 7A.
Figure 7C:
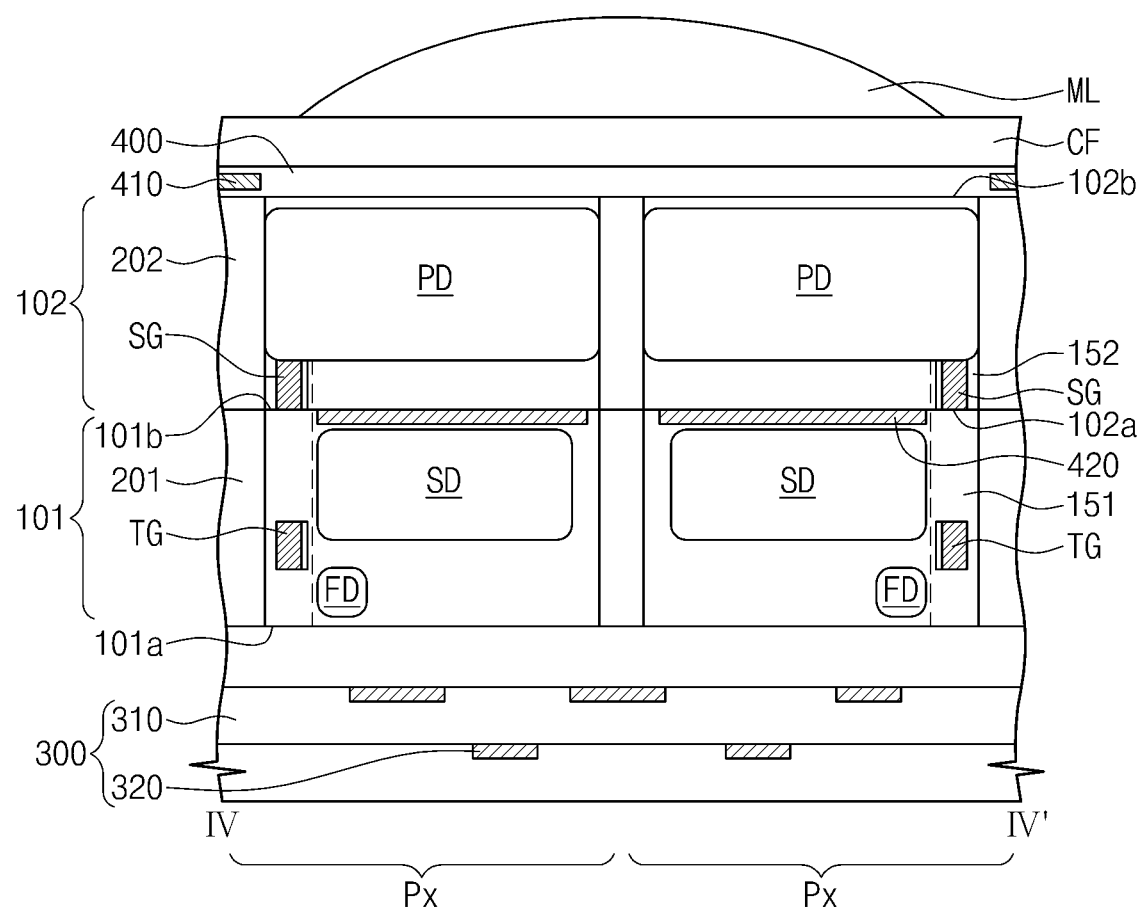
FIG. 7C is a cross-sectional view taken along a line IV-IV' of FIG. 7B.

FIG. 7A is a plan view illustrating an image sensor according to yet still another exemplary embodiment. FIG. 7B is an enlarged view of a region 'I' of FIG. 7A to illustrate a unit pixel of the image sensor of FIG. 7A. FIG. 7C is a cross-sectional view taken along a line IV-IV' of FIG. 7B. Hereinafter, the description of the same elements as described above will be omitted or briefly mentioned to avoid duplicate explanation.

Referring to FIGS. 7A and 7B, an image sensor may have a unit pixel P, and the unit pixel P may include a plurality of sub-pixels Px. Each of the sub-pixels Px may include a storage diode SD and a photoelectric conversion element PD that vertically overlapping with each other. A plurality of the sub-pixels Px will be described hereinafter.

Referring to FIGS. 7B and 7C, the image sensor may include a lower substrate 101 and an upper substrate 102 disposed on the lower substrate 101. The upper substrate 102 may include a semiconductor material or a silicon-on-insulator (SOI). The upper substrate 102 may include a first surface 102a and a second surface 102b opposite to each other. The first surface 102a of the upper substrate 102 may correspond to a front side of the substrate 100, and the second substrate 102b of the upper substrate 102 may correspond to a back side of the substrate 100. A buffer layer 400 may be disposed on the second surface 102b of the upper substrate 102. A color filter CF and a microlens ML may be disposed on the buffer layer 400 of each of the unit pixels P. A grid pattern 410 may be provided in the buffer layer 400.

An upper device isolation pattern 202 may be disposed in the upper substrate 102 to define the unit pixel P and the sub-pixels Px. In an exemplary embodiment, the upper device isolation pattern 202 may penetrate the upper substrate 102. The upper device isolation pattern 202 may be a deep-trench isolation pattern or a dopant region doped with dopants, similar to the device isolation pattern 200 as described with reference to FIG. 2C.

The photoelectric conversion elements PD may be provided in the respective upper substrate 102 of the sub-pixels Px. The photoelectric conversion elements PD may be laterally arranged. The upper device isolation pattern 202 may be in contact with sidewalls of the photoelectric conversion elements PD, and thus, full well capacities of the photoelectric conversion elements PD may be improved.

Storage gates SG may be adjacent to the first surface 102a of the upper substrate 102. Upper insulating portions 152 may be provided in the upper substrate 102. The storage gates SG may be disposed in the upper insulating portions 152. The storage gates SG are disposed in the upper substrate 102 in FIG. 7C. Alternatively, the storage gates SG may be disposed in the lower substrate 101.

The lower substrate 101 may be disposed on the first surface 102a of the upper substrate 102. The lower substrate 101 may include a semiconductor material or a SOI. The lower substrate 101 may include a first surface 101a and a second surface 101b opposite to each other.

A lower device isolation pattern 201 may be disposed in the lower substrate 101 to define the unit pixel P and the sub-pixels Px. The lower device isolation pattern 201 may be a dopant region doped with dopants, or a deep-trench isolation pattern.

The storage diodes SD may be provided in the respective lower substrate 101 of the sub-pixels Px. As illustrated in FIG. 7B, the storage diodes SD may overlap with the photoelectric conversion elements PD, respectively, when viewed from a plan view.

A light-shielding pattern 420 may be disposed on the second surface 101b of the lower substrate 101 to cover the storage diode SD. Alternatively, the light-shielding pattern 420 may be omitted. In this case, light incident from the second surface 102b of the upper substrate 102 may be shielded by the photoelectric conversion elements PD, so that the light may not be incident on the storage diodes SD.

Floating diffusion regions FD may be disposed in the lower substrate 101. For example, the floating diffusion regions FD may be regions doped with N-type dopants. Each of the floating diffusion regions FD may be disposed at a side of each of the storage diodes SD. Here, the side of each of the storage diodes SD may include a bottom surface or a sidewall. In other words, the floating diffusion region FD may be adjacent to the bottom surface or the sidewall of storage diode SD. In an exemplary embodiment, the floating diffusion region FD may be disposed between the storage diode SD and the first surface 101a of the lower substrate 101. Lower insulating portions 151 may be provided in the lower substrate 101. The transfer gates TG may be provided in the lower insulating portions 151 of the sub-pixels Px, respectively. The transfer gate TG may be adjacent to the lower substrate 101 between the storage diode SD and the floating diffusion region FD in each of the sub-pixels Px. The transfer gates TG are disposed on sidewalls of the storage diodes SD in FIG. 7C. However, the inventive concepts are not limited thereto. In another exemplary embodiment, the transfer gates TG may be disposed on bottom surfaces of the storage diodes SD.

An interconnection structure 300 may be disposed on the first surface 101a of the lower substrate 101. The interconnection structure 300 may include interlayer insulating layers 310 and interconnections 320.

In other embodiments, the unit pixel P may have one of the planar shapes described with reference to FIGS. 4A, 4B, and 4C. In still other embodiments, the number of the sub-pixels Px included in the unit pixel P may be various as described with reference to FIGS. 5A and 5B.

Figure 8A:
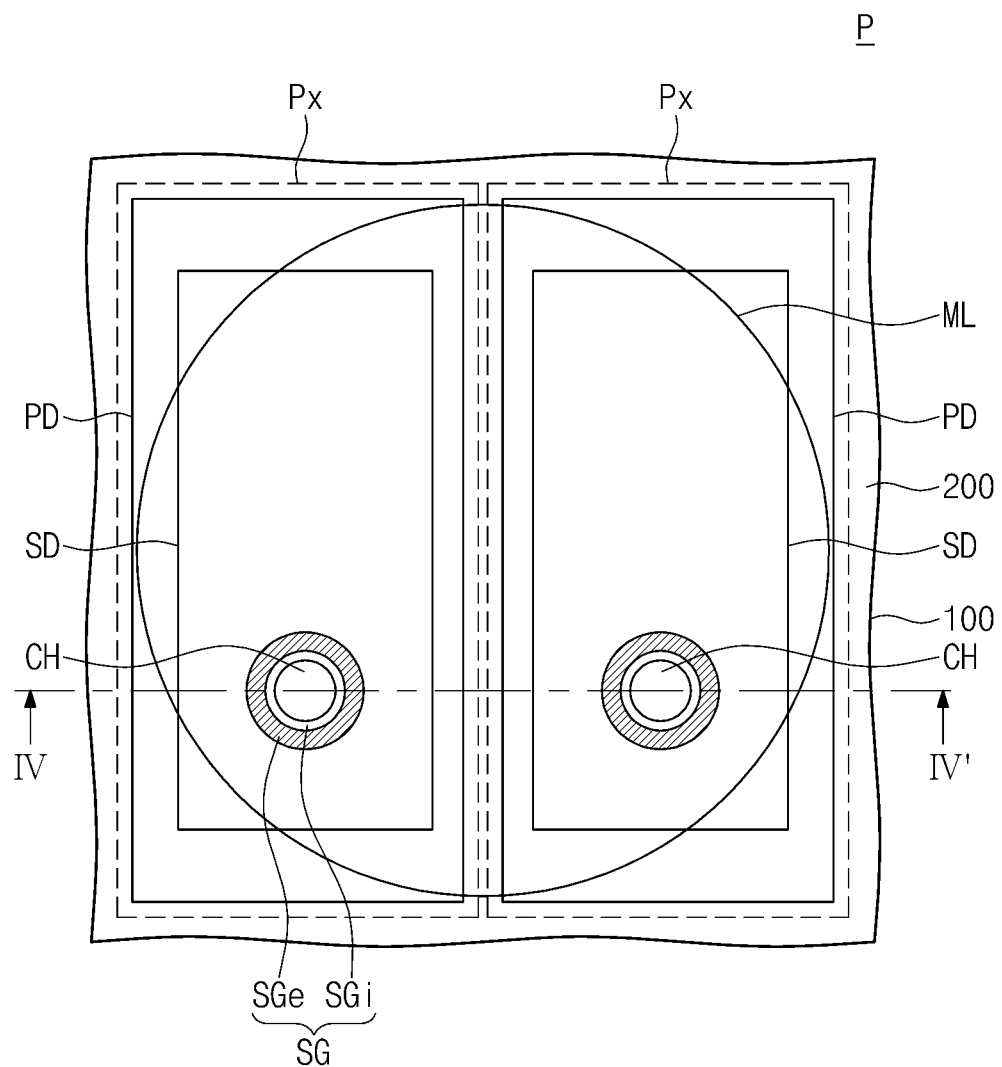
FIG. 8A is a plan view illustrating a unit pixel of an image sensor according to yet still another exemplary embodiment.
Figure 8B:
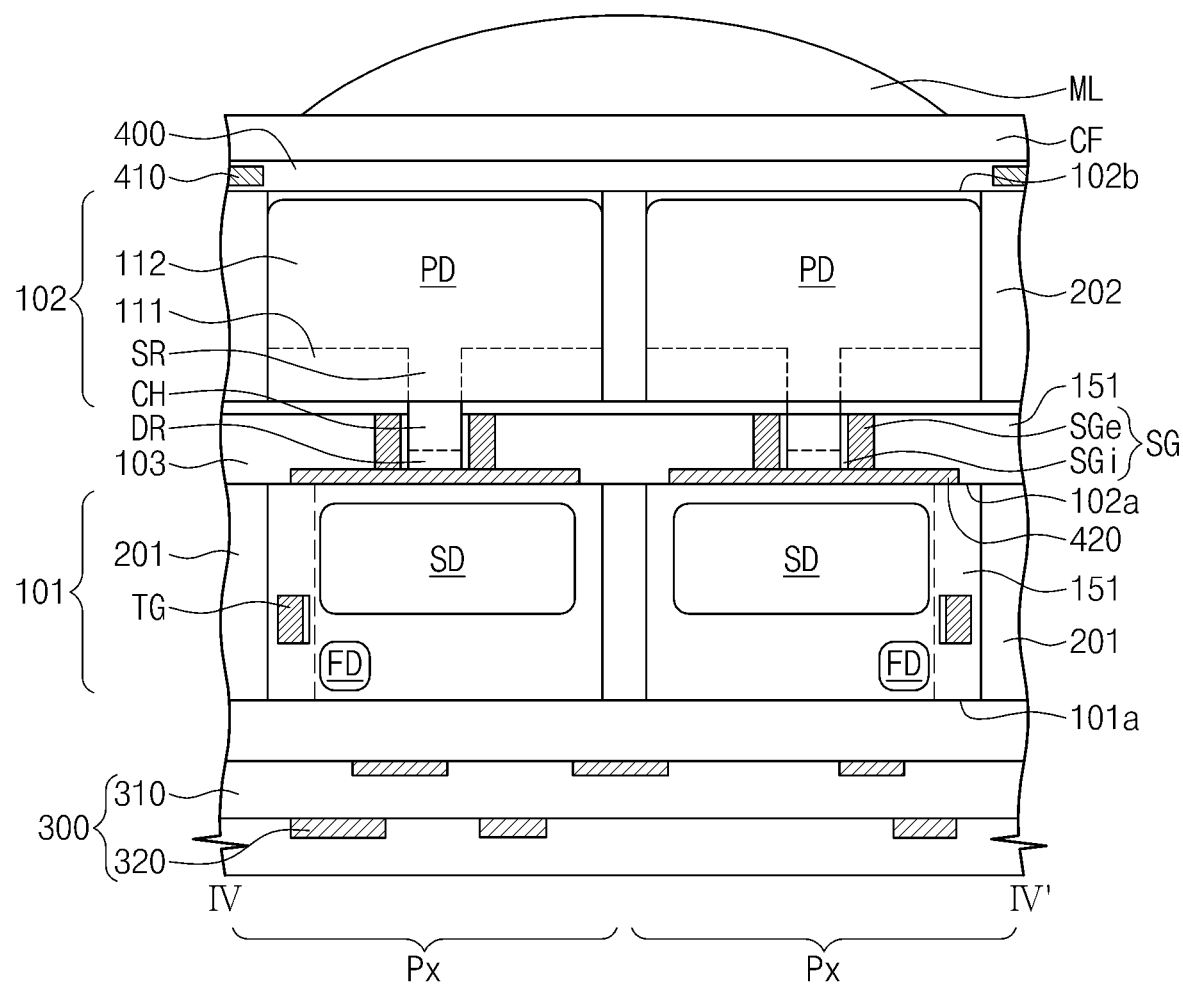
FIG. 8B is a cross-sectional view taken along a line IV-IV' of FIG. 8A.

FIG. 8A is a plan view corresponding to the region 'I' of FIG. 7A to illustrate a unit pixel of an image sensor according to yet still another exemplary embodiment. FIG. 8B is a cross-sectional view taken along a line IV-IV' of FIG. 8A. Hereinafter, the description of the same elements as described above will be omitted or briefly mentioned to avoid duplicate explanation.

Referring to FIGS. 7A, 8A, and 8B, a unit pixel P of an image sensor may include a plurality of sub-pixels Px. An upper device isolation pattern 202 may define the unit pixel P and the sub-pixels Px in an upper substrate 102.

A photoelectric conversion element PD may be provided in the upper substrate 102 of each of the sub-pixels Px. The photoelectric conversion elements PD may be laterally spaced apart from each other. The upper device isolation pattern 202 may be in contact with sidewalls of the photoelectric conversion elements PD. Each of the photoelectric conversion elements PD may include a first dopant region 111 and a second dopant region 112, as described with reference to FIG. 2C. The first dopant region 111 may be adjacent to a bottom surface (e.g., a first surface 102a) of the upper substrate 102. For example, the first dopant region 111 may be doped with P-type dopants. The second dopant region 112 may be disposed at a deeper position from the first surface 102a of the upper substrate 102, compared to the first dopant region 111. For example, the second dopant region 112 may be doped with N-type dopants.

A lower substrate 101 may be disposed on the first surface 102a of the upper substrate 102. A lower device isolation pattern 201 may be disposed in the lower substrate 101 to define the unit pixel P and the sub-pixels Px. A storage diode SD may be provided in the lower substrate 101 of each of the sub-pixels Px. The photoelectric conversion elements PD may be disposed over top surfaces of the storage diodes SD, respectively. As illustrated in FIG. 7A, the photoelectric conversion elements PD may overlap with the storage diodes SD, respectively, when viewed from a plan view.

A floating diffusion region FD and a transfer gate TG may be provided in the lower substrate 101 of each of the sub-pixels PX. For example, the floating diffusion regions FD may be regions doped with N-type dopants. The transfer gate TG may be adjacent to a portion of the lower substrate 101 which is disposed between the storage diode SD and the floating diffusion region FD in each of the sub-pixels Px. The transfer gates TG may be disposed in lower insulating portions 151 of the lower substrate 101, respectively. The floating diffusion regions FD may be disposed under bottom surfaces of the storage diodes SD in FIG. 8B. Alternatively, the floating diffusion regions FD may be disposed on sidewalls of the storage diodes SD.

A connecting structure 103 may be disposed between the lower substrate 101 and the upper substrate 102. For example, the connecting structure 103 may include an insulating material such as silicon oxide.

Storage gates SG may be provided in the connecting structure 103 of the sub-pixels Px, respectively. Each of the storage gates SG may be disposed between the photoelectric conversion element PD and the storage diode SD in each of the sub-pixels Px. As illustrated in FIG. 8A, the storage gates SG may overlap with the photoelectric conversion elements PD and the storage diodes SD, respectively, when viewed from a plan view.

Each of the storage gates SG may have a vertical channel structure. Channel regions CH of the storage gates SG may be formed in the connecting structure 103. Each of the channel regions CH may be provided between the photoelectric conversion element PD and the storage diode SD in each of the sub-pixels Px. As illustrated in 8A, the channel regions CH may overlap with the photoelectric conversion elements PD and the storage diodes SD, respectively, when viewed from a plan view. In addition, the channel regions CH may have circular shapes. The channel regions CH may include a silicon material. For example, the channel regions CH may be regions doped with P-type dopants.

Each of the storage gates SG may include a storage gate insulating layer SGi and a storage gate electrode SGe. The storage gate electrode SGe may be disposed on a sidewall of each of the channel regions CH to surround each of the channel regions CH. In an exemplary embodiment, each of the storage gate electrodes SGe may have a closed-loop shape. The storage gate electrodes SGe may include a conductive material, e.g., poly-silicon and/or a metal. Each of the storage gate insulating layers SGi may be disposed between the channel region CH and the storage gate electrode SGe in each of the sub-pixels Px. The storage gate insulating layers SGi may include an insulating material, e.g., silicon oxide, silicon nitride, and/or silicon oxynitride.

As illustrated in FIG. 8B, a drain region DR may be provided at or under a bottom surface of each of the channel regions CH. In an exemplary embodiment, the drain regions DR may be regions doped with N-type dopants. The second dopant region 112 of the photoelectric conversion element PD may have a portion that extends into the first dopant region 111 of the photoelectric conversion element PD. The extending portion of the second dopant region 112 may overlap with the channel region CH when viewed from a plan view. The extending portion of the second dopant region 112 may serve as a source region SR of the storage gate SG. Changes generated and accumulated in the photoelectric conversion element PD may be transferred to the storage diode SD by the storage gate SG.

In each of the sub-pixels Px, a light-shielding pattern 420 may be provided in the connecting structure 103 and may be disposed between the channel region CH and the storage diode SD. The light-shielding pattern 420 may cover a top surface of the storage diode SD to prevent light from being incident on the storage diode SD. The light-shielding pattern 420 may include a conductive material such as a metal. Charges may easily move between the channel region CH and the storage diode SD through the light-shielding pattern 420.

An interconnection structure 300 may be disposed on or below a bottom surface (e.g., the first surface 101a) of the lower substrate 101. A buffer layer 400, a grid pattern 410, a color filter CF, and a microlens ML may be disposed on the second surface 102b of the upper substrate 102.

Figure 9A:
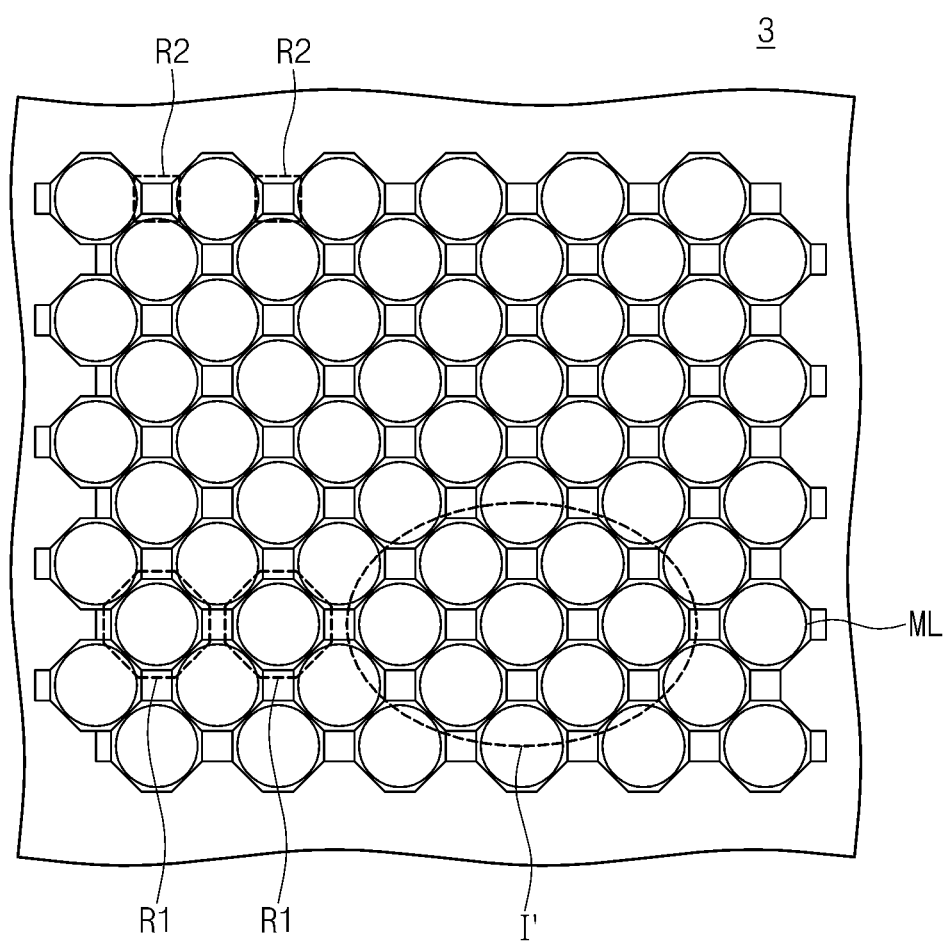
FIG. 9A is a plan view illustrating an image sensor according to yet still another exemplary embodiment.
Figure 9B:
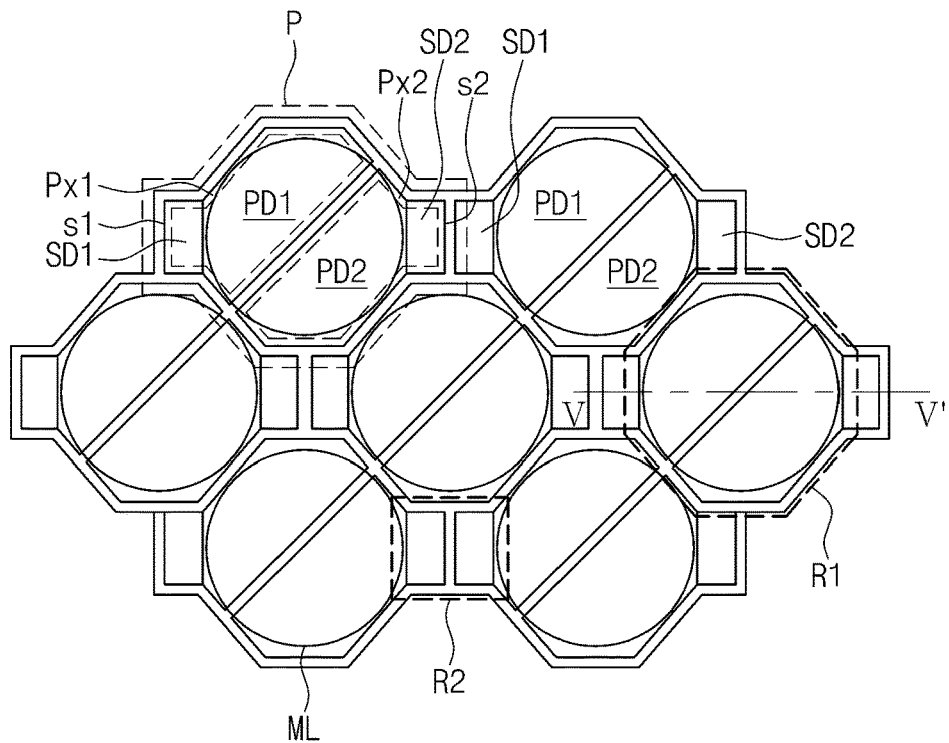
FIGS. 9B and 9C are enlarged views of a portion 'I' of FIG. 9A to illustrate unit pixels of an image sensor according to yet still other exemplary embodiments.
Figure 9C:
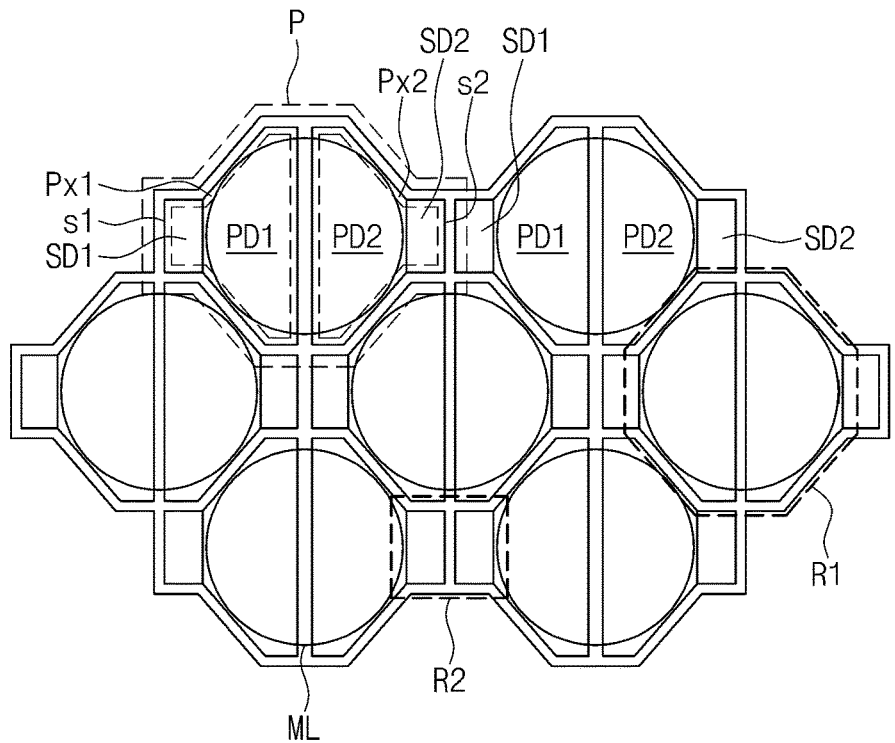
Figure 9D:
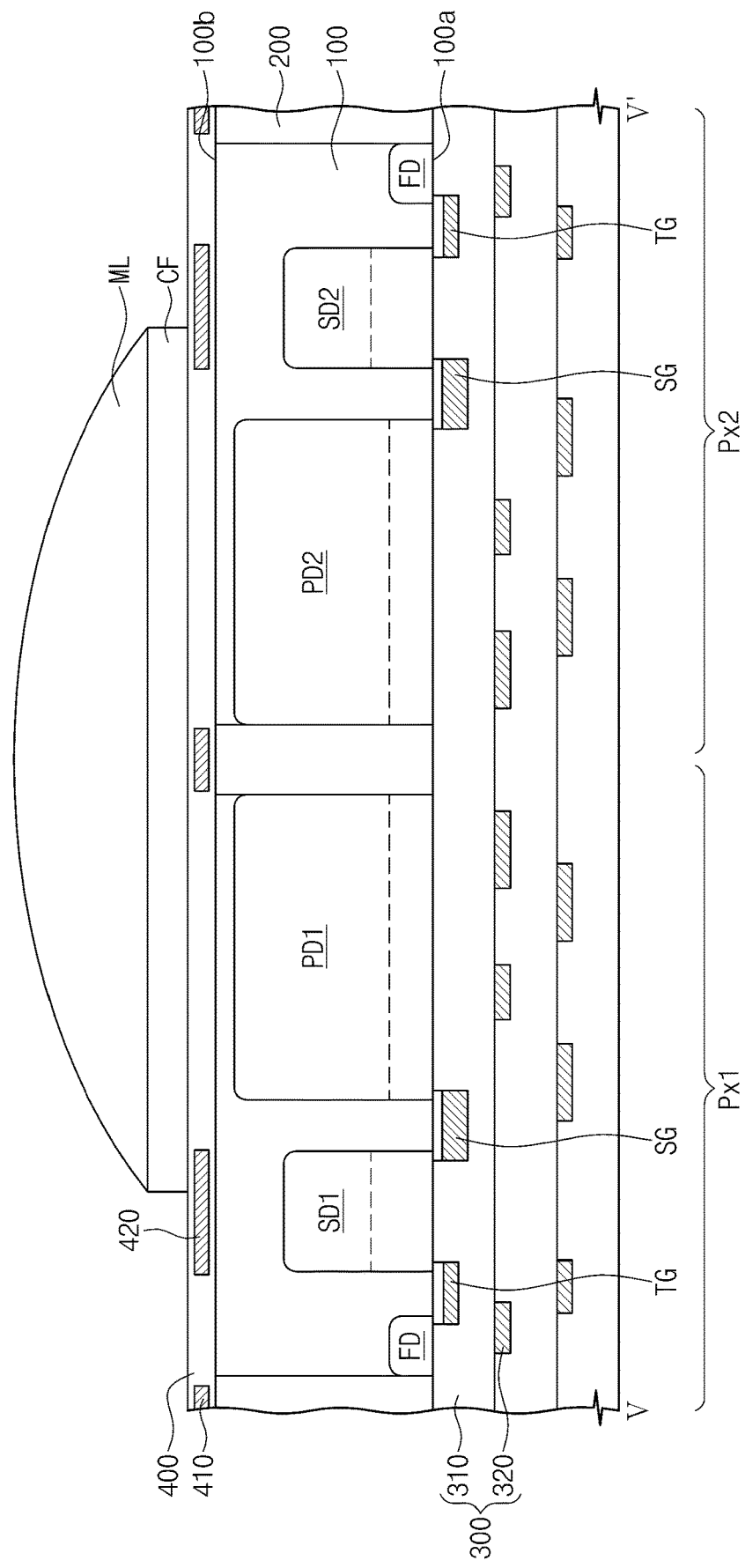
FIG. 9D is a cross-sectional view taken along a line V-V' of FIG. 9B.

FIG. 9A is a plan view illustrating an image sensor according to yet still another exemplary embodiment. FIGS. 9B and 9C are enlarged views of a portion 'I' of FIG. 9A to illustrate unit pixels of an image sensor according to yet still other exemplary embodiments. FIG. 9D is a cross-sectional view taken along a line V-V' of FIG. 9B. Hereinafter, a plurality of unit pixels will be described.

Referring to FIGS. 9A, 9B, and 9C, an image sensor 3 may include unit pixels P. Each of the unit pixels P may include a plurality of sub-pixels, for example, a first sub-pixel Px1 and a second sub-pixel Px2. The first sub-pixel Px1 may include a first photoelectric conversion element PD1 and a first storage diode SD1, and the second sub-pixel Px2 may include a second photoelectric conversion element PD2 and a second storage diode SD2. The photoelectric conversion elements PD1 and PD2 may be disposed horizontally with the storage diodes SD1 and SD2. A device isolation pattern 200 may define the unit pixels P and the sub-pixels Px1 and Px2. The sub-pixels Px1 and Px2 may be variously partitioned. In an exemplary embodiment, a shape of the second sub-pixel Px2 and a shape of the first sub-pixel Px1 may be laterally asymmetric, as illustrated in FIG. 9B. In another exemplary embodiment, the shape of the second sub-pixel Px2 and the shape of the first sub-pixel Px1 may be laterally symmetric, as illustrated in FIG. 9C.

As illustrated in FIGS. 9A to 9C, the photoelectric conversion elements PD1 and PD2 may be adjacent to each other in each of the unit pixels P. The photoelectric conversion elements PD1 and PD2 may constitute a photoelectric element region R1 having an octagonal shape in each of the unit pixels P when viewed from a plan view. The photoelectric element region R1 of the unit pixels P may be arranged along rows and columns.

In each of the unit pixels P, the storage diodes SD1 and SD2 may be spaced apart from each other. The first storage diode SD1 may be disposed to be adjacent to a first side s1 of one of the unit pixels P, and the second storage diode SD2 may be disposed to be adjacent to a second side s2 of the one of the unit pixels P. In an exemplary embodiment, the second side s2 may be opposite to the first side s1. The photoelectric conversion elements PD1 and PD2 may be disposed between the storage diodes SD1 and SD2. The first storage diode SD1 of one of two unit pixels P adjacent to each other in a row direction may be adjacent to the second storage diode SD2 of the other one of the two unit pixels P. The first and second storage diodes SD1 and SD2, adjacent to each other, of the two unit pixels P may constitute a storage element region R2 having a quadrilateral shape. In the image sensor 3, the storage element region R2 may be provided in plurality. The storage elements regions R2 may be arranged along rows and columns. An edge of each of the storage elements regions R2 may be surrounded by the photoelectric element regions R1.

Microlenses ML may be disposed on the photoelectric element regions R1 of the unit pixels P to cover a substantial portion of the photoelectric element regions R1, respectively. The microlenses ML may not cover the storage element regions R2. As illustrated in FIGS. 9B and 9C, the microlenses ML may overlap with the photoelectric element regions R1, respectively, when viewed from a plan view.

Referring to FIG. 9D, each of the sub-pixels Px1 and Px2 may include the device isolation pattern 200, the photoelectric conversion element PD1 or PD2, a storage gate SG, the storage diode SD1 or SD2, a transfer gate TG, a floating diffusion region FD, an interconnection structure 300, and a light-shielding pattern 420. The substrate 100, the device isolation pattern 200, the photoelectric conversion element PD1 or PD2, the storage gate SG, the storage diode SD1 or SD2, the transfer gate TG, the floating diffusion region FD, the interconnection structure 300, the light-shielding pattern 420, and the microlens ML may be similar to or the same as the corresponding elements that have been described with reference to FIG. 2C. A color filter CF may be disposed on the second surface 100*b* of the substrate 100 and may not cover the storage element regions R2. The microlens ML may be disposed on the color filter CF.

In another exemplary embodiment, the image sensor 3 may further include at least one of the device isolation layer 250 or the assistant light-shielding pattern 350 as illustrated in FIG. 2D. In still another exemplary embodiment, the image sensor 3 may further include the sub-microlens MLs as illustrated in FIGS. 3A and 3B.

Figure 10A:
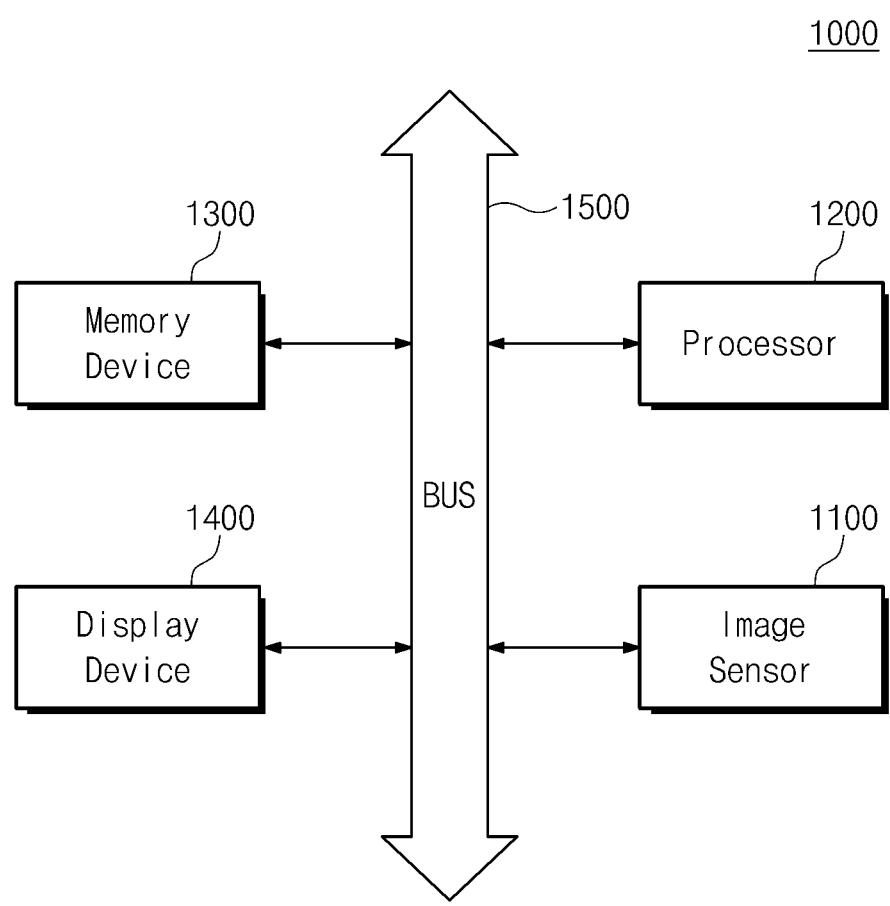
FIG. 10A is a schematic block diagram illustrating a processor-based system including an image sensor according to an exemplary embodiment.
Figure 10B:
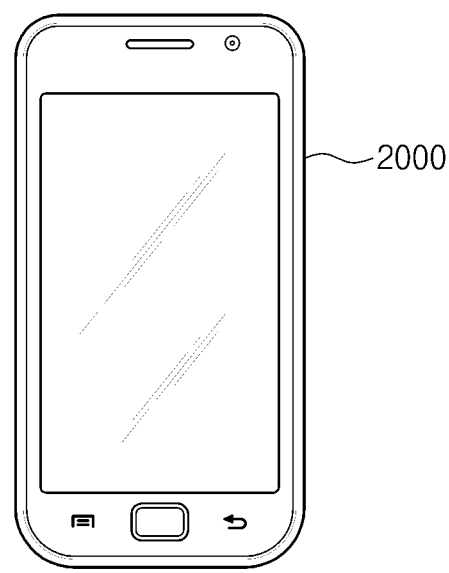
FIG. 10B illustrates an electronic device including an image sensor according to an exemplary embodiment.

FIG. 10A is a schematic block diagram illustrating a processor-based system including an image sensor according to an exemplary embodiment. FIG. 10B illustrates an electronic device including an image sensor according to an exemplary embodiment. For example, the electronic device may include a digital camera or a mobile device.

Referring to FIG. 10A, a processor-based system 1000 may include an image sensor 1100, a processor 1200, a memory device 1300, a display device 1400, and a system bus 1500. The image sensor 1100 may capture information about an external image in response to control signals of the processor 1200. The processor 1200 may store the captured image information into the memory device 1300 through the system bus 1500. The processor 1200 may display the image information stored in the memory device 1300 on the display device 1400.

The system 1000 may be, but not limited to, a computer system, a camera system, a scanner, a mechanized clock system, a navigation system, a video phone, a management system, an auto-focus system, a tracking system, a sensing system, or an image stabilization system. If the processor-based system 1000 is applied to the mobile device, the system 100 may further include a battery used to supply an operating voltage to the mobile device.

FIG. 10B illustrates a mobile phone 2000 implemented with the image sensor according to the aforementioned exemplary embodiments. Additionally, for example, the image sensor according to the aforementioned exemplary embodiments may be applied to a smart phone, a personal digital assistant (PDA), a portable multimedia player (PMP), a digital multimedia broadcast (DMB) device, a global positioning system (GPS) device, a handled gaming console, a portable computer, a web tablet, a wireless phone, a digital music player, a memory card, and/or other electronic products transmitting and/or receiving information by wireless.

Each of the unit pixels of the image sensor according to the exemplary embodiments includes the plurality of photoelectric conversion elements and the plurality of storage diodes, and thus, the image sensor may provide an excellent image signal of a moving subject. In addition, each of the unit pixels includes the plurality of photoelectric conversion elements, so that the image sensor may correct the image signal of the subject. In addition, the image sensor may obtain the 3D depth information of the subject. The image sensor may not need an additional focus-detecting pixel, so that the resolution of the image sensor may be improved.

Although a few embodiments have been shown and described, it would be appreciated by those skilled in the art that changes may be made in the exemplary embodiments without departing from the principles and spirit of the disclosure, the scope of which is defined in the claims and their equivalents.

What is claimed is:

1. An image sensor comprising:
    a first photoelectric conversion element;
    a first transfer gate configured to transfer an electrical signal generated at the first photoelectric conversion element to a first floating diffusion region;
    a second photoelectric conversion element;
    a second transfer gate configured to transfer an electrical signal generated at the second photoelectric conversion element to a second floating diffusion region; and
    a micro lens covering the first photoelectric conversion element and the second photoelectric conversion element,
    wherein the first floating diffusion region and the second floating diffusion region are isolated by a first portion of a device isolation pattern, a second portion of the device isolation pattern defining a unit pixel and disposed between adjacent unit pixels, and wherein the device isolation pattern comprises the first portion and the second portion.

2. The image sensor of claim 1, wherein the first photoelectric conversion element and the second photoelectric conversion element are surrounded by the device isolation pattern in a plan view.

3. The image sensor of claim 1, wherein the first photoelectric conversion element is laterally spaced apart from with the first floating diffusion region.

4. The image sensor of claim 1, wherein the first photoelectric conversion element overlaps with the first floating diffusion region in a plan view.

5. The image sensor of claim 1, further comprising a substrate in which the first photoelectric conversion element, the second photoelectric conversion element, the first floating diffusion region, and the second floating diffusion region are provided therein.

6. The image sensor of claim 5, wherein the substrate further comprises a lower substrate and an upper substrate on the lower substrate, wherein the first floating diffusion region and the second floating diffusion region are disposed in the lower substrate, and wherein the first photoelectric conversion element and the second photoelectric conversion element are disposed in the upper substrate.

7. The image sensor of claim 1, further comprising a color filter provided between the first photoelectric conversion element and the micro lens and between the second photoelectric conversion element and the micro lens.

8. The image sensor of claim 1, further comprising a light-shielding pattern disposed between the first photoelectric conversion element and the first floating diffusion region.

9. The image sensor of claim 1, further comprising a storage diode between the first photoelectric conversion element and the first floating diffusion region, wherein the storage diode receive charges generated and accumulated in the first photoelectric conversion elements and transfer the charges to the first floating diffusion region.

10. The image sensor of claim 1, wherein the micro lens covers the first photoelectric conversion element and the second photoelectric conversion element in a vertical direction, and the first photoelectric conversion element is spaced apart from with the first floating diffusion region in a horizontal direction.

11. An image sensor comprising:

a first photoelectric conversion element;

a first transfer gate configured to transfer an electrical signal generated at the first photoelectric conversion element to a first floating diffusion region;

a second photoelectric conversion element;

a second transfer gate configured to transfer an electrical signal generated at the second photoelectric conversion element to a second floating diffusion region; and a micro lens covering the first photoelectric conversion element and the second photoelectric conversion element, wherein the first floating diffusion region and the second floating diffusion region are isolated by an isolation pattern, and wherein the first photoelectric conversion element and the second photoelectric conversion element are surrounded by a device isolation pattern in a plan view, the device isolation pattern defining a unit pixel.

12. An image sensor comprising:

a first photoelectric conversion element;

a first transfer gate configured to transfer an electrical signal generated at the first photoelectric conversion element to a first floating diffusion region;

a second photoelectric conversion element;

a second transfer gate configured to transfer an electrical signal generated at the second photoelectric conversion element to a second floating diffusion region;

a micro lens covering the first photoelectric conversion element and the second photoelectric conversion element; and a substrate in which the first photoelectric conversion element, the second photoelectric conversion element, the first floating diffusion region, and the second floating diffusion region are provided therein, wherein the first floating diffusion region and the second floating diffusion region are isolated by an isolation pattern.

* * * * *